United States Patent
Mikuriya

(10) Patent No.: US 9,900,026 B2
(45) Date of Patent: Feb. 20, 2018

(54) DIFFERENTIAL DATA CREATING APPARATUS, DATA UPDATING APPARATUS, AND DIFFERENTIAL DATA CREATING METHOD

(71) Applicant: MITSUBISHI ELECTRIC CORPORATION, Tokyo (JP)

(72) Inventor: Makoto Mikuriya, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/323,041

(22) PCT Filed: Jul. 28, 2014

(86) PCT No.: PCT/JP2014/069790
§ 371 (c)(1),
(2) Date: Dec. 29, 2016

(87) PCT Pub. No.: WO2016/016923
PCT Pub. Date: Feb. 4, 2016

(65) Prior Publication Data
US 2017/0141789 A1    May 18, 2017

(51) Int. Cl.
*H03M 7/34* (2006.01)
*H03M 7/30* (2006.01)

(52) U.S. Cl.
CPC .............................. *H03M 7/3084* (2013.01)

(58) Field of Classification Search
CPC .................................................. H03M 7/3084
USPC ................... 341/50, 51, 107, 106, 165, 163
See application file for complete search history.

(56) References Cited

U.S. PATENT DOCUMENTS

| | | | |
|---|---|---|---|
| 8,797,061 | B2 | 8/2014 | Margabandu et al. |
| 2003/0163496 | A1* | 8/2003 | Terazono .......... G06F 17/30174 |
| 2006/0106888 | A1 | 5/2006 | Iida et al. |
| 2013/0162290 | A1 | 6/2013 | Margabandu et al. |

FOREIGN PATENT DOCUMENTS

| | | |
|---|---|---|
| CN | 103177152 A | 6/2013 |
| EP | 0448045 B1 | 6/1995 |
| JP | 63-305439 A | 12/1988 |
| JP | 2001-249796 A | 9/2001 |
| JP | 2004-152136 A | 5/2004 |
| JP | 2006-48640 A | 2/2006 |
| JP | 2006-79492 A | 3/2006 |
| JP | 2007-219768 A | 8/2007 |
| JP | 2008-204287 A | 9/2008 |

* cited by examiner

*Primary Examiner* — Peguy Jean Pierre
(74) *Attorney, Agent, or Firm* — Birch, Stewart, Kolasch & Birch, LLP

(57) ABSTRACT

The present invention aims to provide a technology capable of enhancing the effect of reducing differential data in size. A bit shift unit shifts either of old data and new data in a forward direction and a backward direction of its bit string by each of 0, 1, 2, . . . , and n bit(s) to generate a plurality of data. A copy bit string extracting unit extracts information on copy bit strings based on the plurality of data and other non-shifted data. An additional bit string extracting unit excludes copy bit strings from the new data to extract information on additional bit strings. A differential data generating unit creates differential data based on the information on copy bit strings and the information on additional bit strings.

8 Claims, 29 Drawing Sheets

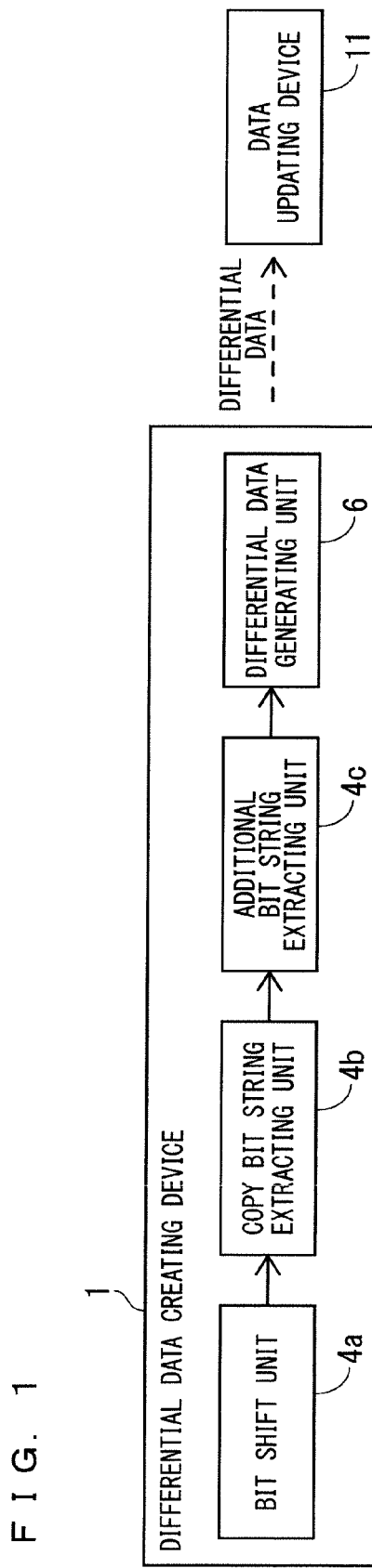
F I G. 1

F I G. 4
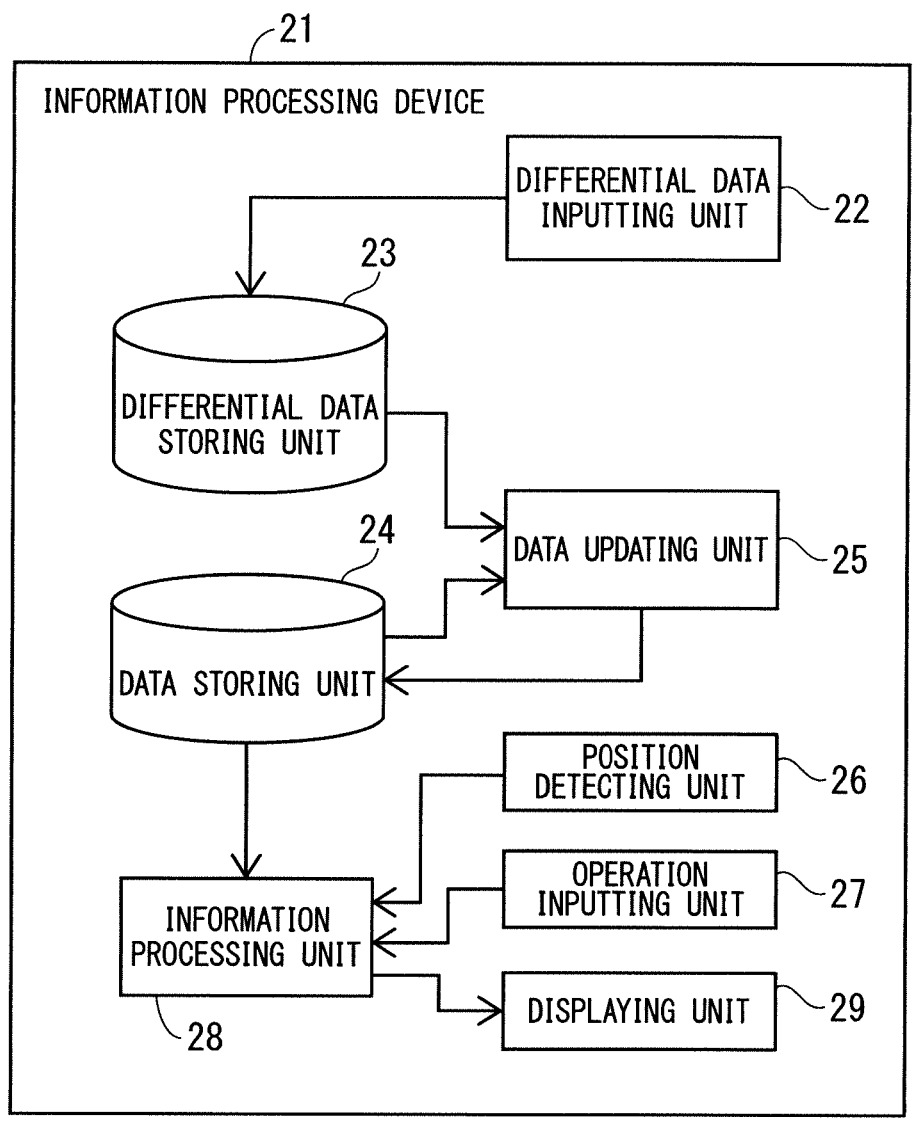

F I G. 1 6
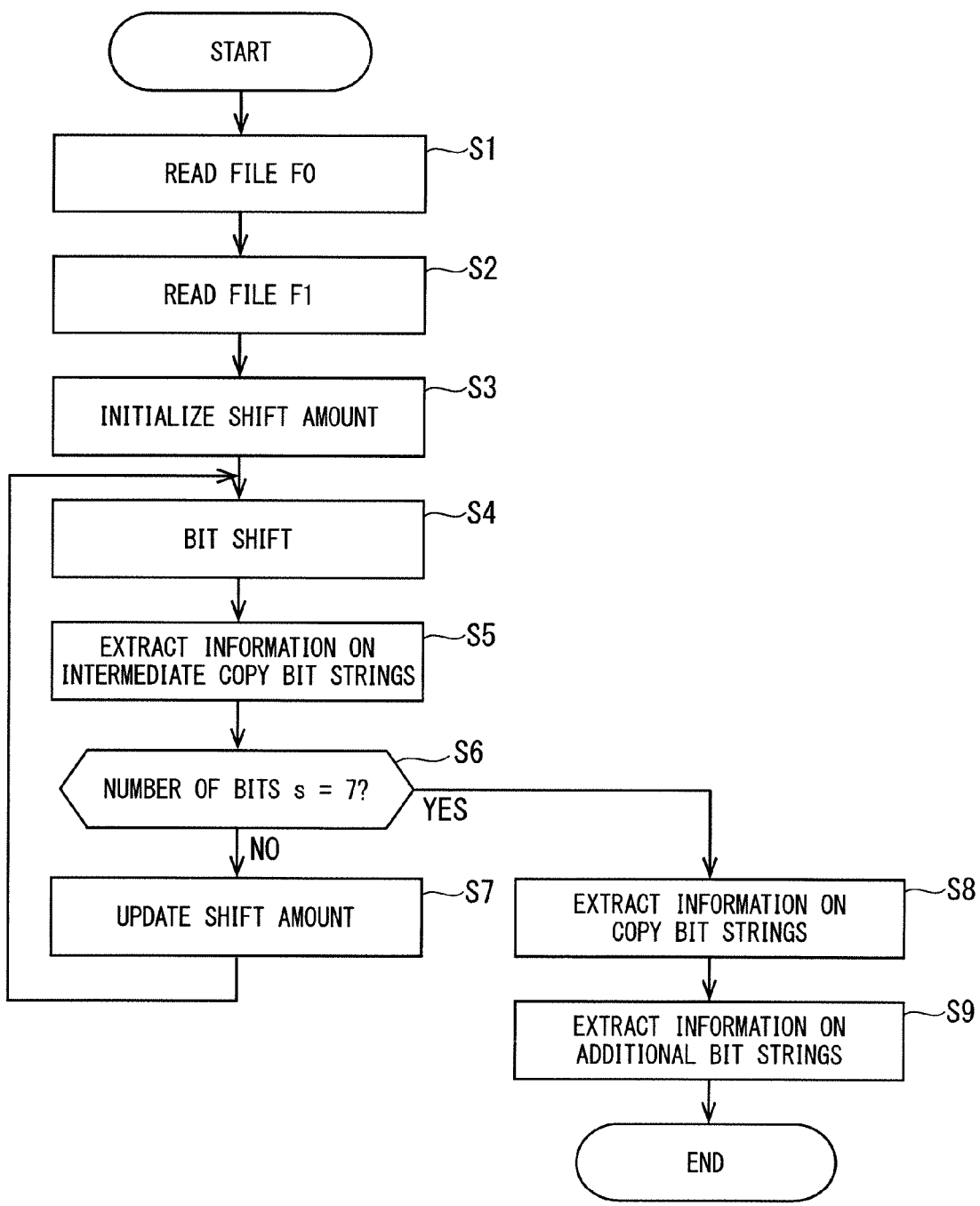

FIG. 17

INFORMATION ON INTERMEDIATE COPY BIT STRINGS

| NUMBER OF INTERMEDIATE COPY BIT STRING RECORDS (= n) |
|---|
| INTERMEDIATE COPY BIT STRING RECORD #0 |
| INTERMEDIATE COPY BIT STRING RECORD #1 |
| ⋮ |
| INTERMEDIATE COPY BIT STRING RECORD #n-1 |

| INTERMEDIATE COPY DESTINATION BIT ADDRESS |
|---|
| INTERMEDIATE COPY SOURCE BIT ADDRESS |
| INTERMEDIATE COPY BIT STRING LENGTH |

FIG. 18

INFORMATION ON COPY BIT STRINGS

| NUMBER OF COPY BIT STRING RECORDS (= m) |
|---|
| COPY BIT STRING RECORD #0 |
| COPY BIT STRING RECORD #1 |
| ⋮ |
| COPY BIT STRING RECORD #m-1 |

| RECORD IDENTIFIER (= 1) |
|---|
| COPY DESTINATION BIT ADDRESS |
| COPY SOURCE BIT ADDRESS |
| COPY BIT STRING LENGTH |

FIG. 19

INFORMATION ON ADDITIONAL COPY BIT STRINGS

| NUMBER OF ADDITIONAL BIT STRING RECORDS (= k) |
|---|
| ADDITIONAL BIT STRING RECORD #0 |
| ADDITIONAL BIT STRING RECORD #1 |
| ⋮ |
| ADDITIONAL BIT STRING RECORD #k-1 |

| RECORD IDENTIFIER (= 2) |
|---|
| ADDITION DESTINATION BIT ADDRESS |
| ADDITIONAL BIT STRING LENGTH |
| ADDITIONAL BIT STRING |

BYTE DIFFERENTIAL DATA

ADDITION COMMAND

COPY COMMAND

END COMMAND

F I G. 2 9
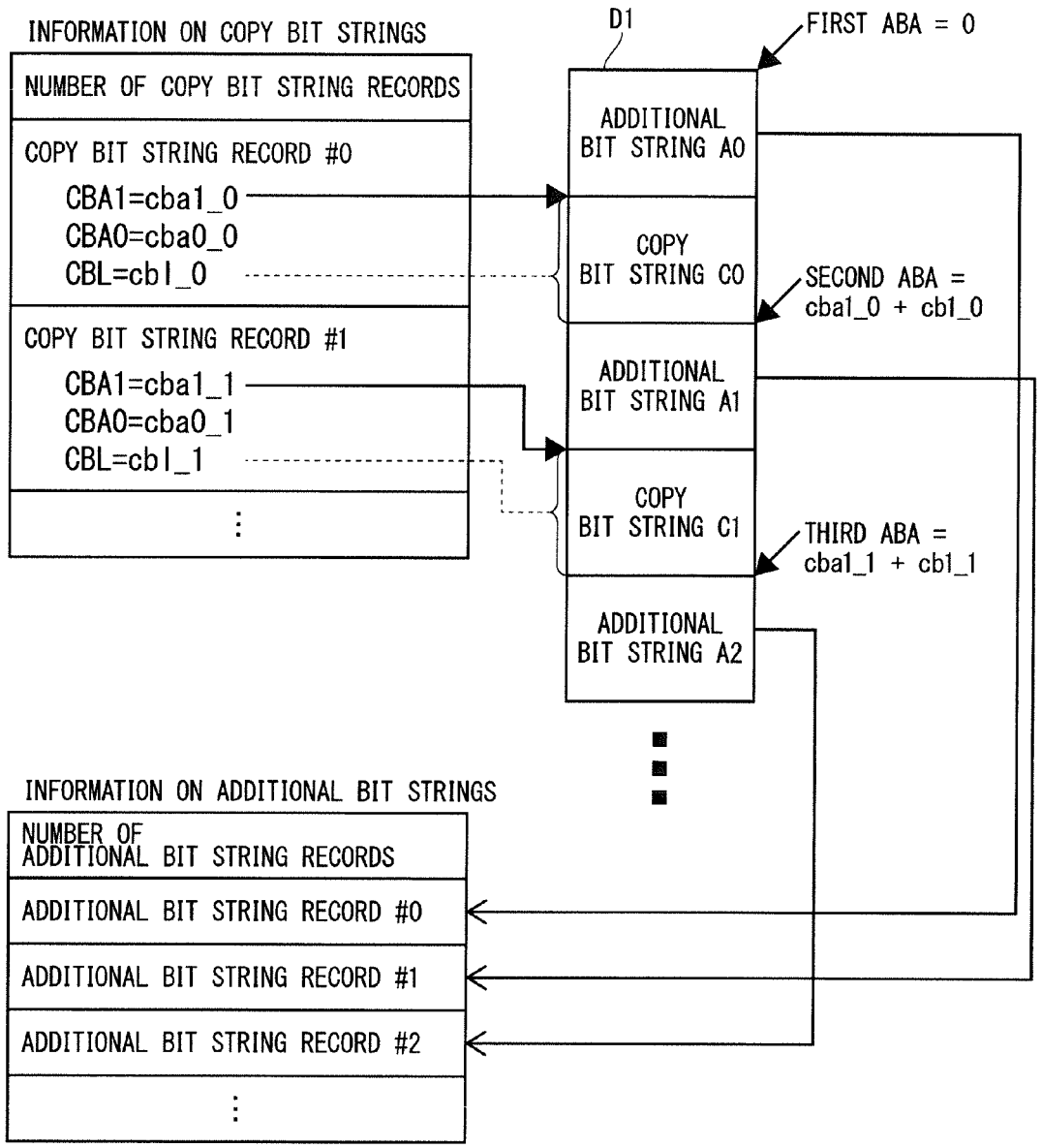

FIG. 33

END COMMAND

| COMMAND CODE (=0) |
|---|

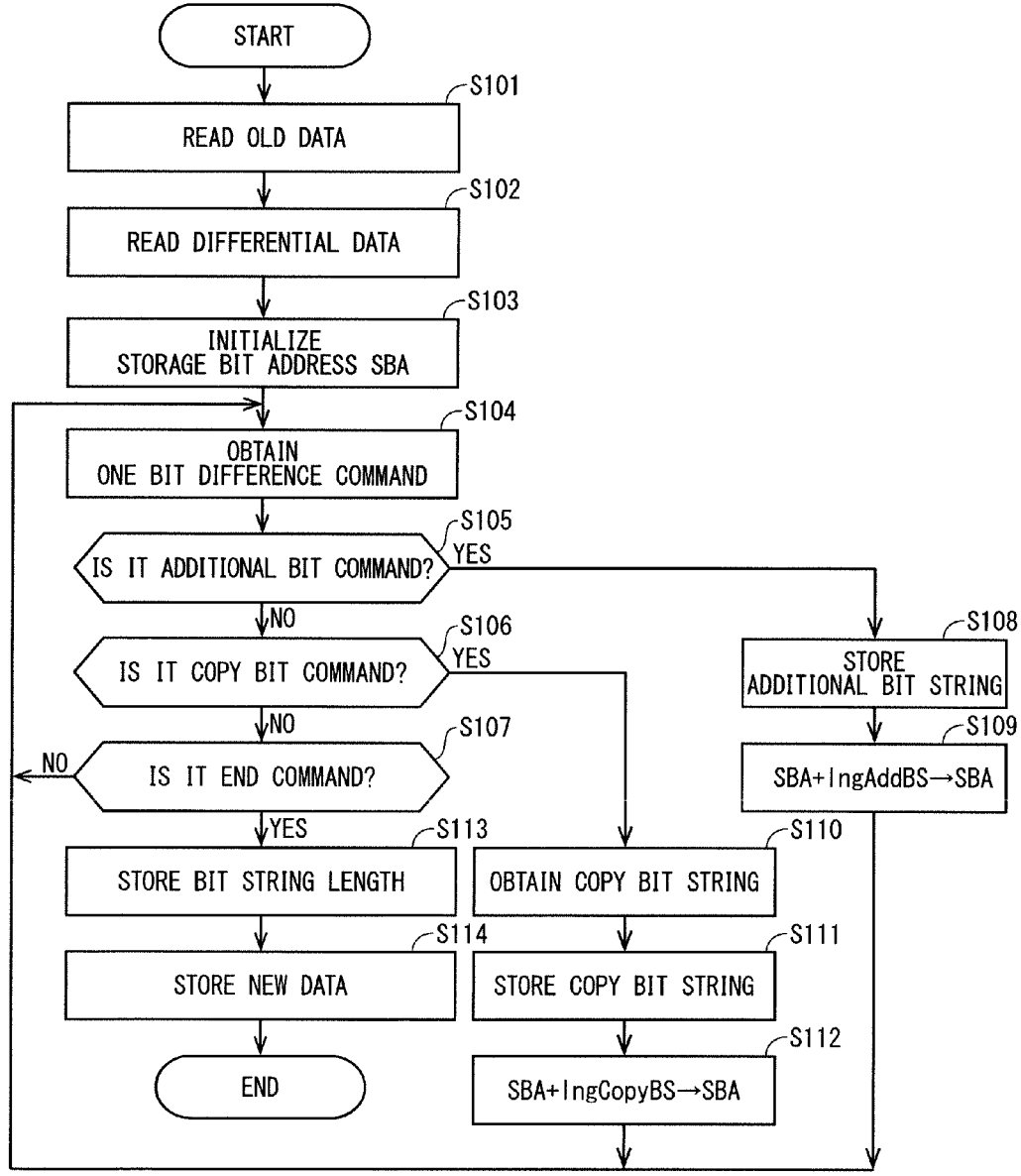

F I G. 3 7
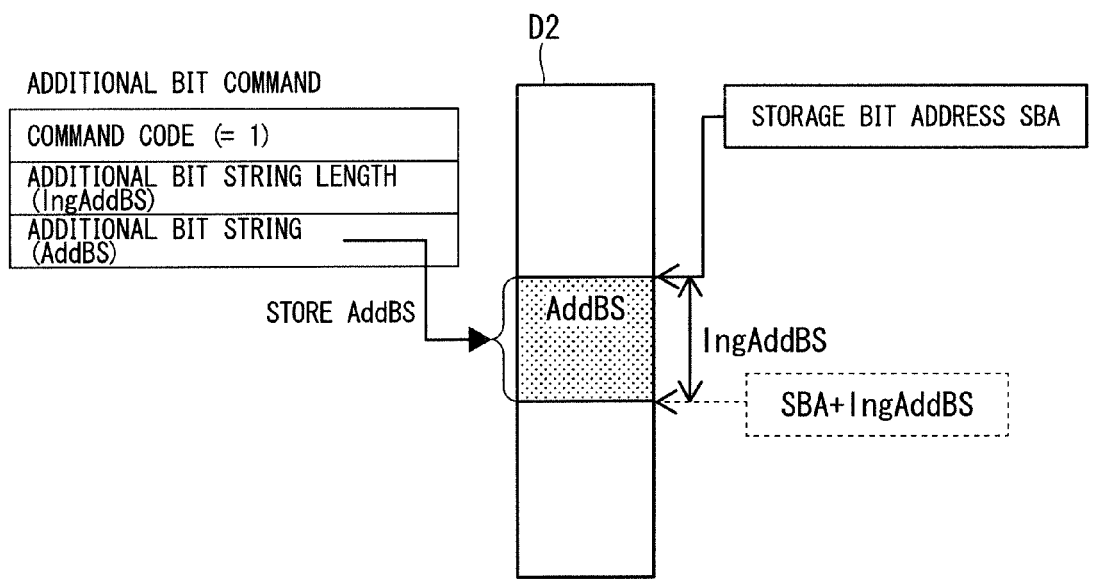

DIFFERENTIAL DATA CREATING APPARATUS, DATA UPDATING APPARATUS, AND DIFFERENTIAL DATA CREATING METHOD

TECHNICAL FIELD

The present invention relates to a differential data creating apparatus and its method for creating differential data for generating, from old data, data identical to new data, and a data updating apparatus that uses the differential data.

BACKGROUND ART

Various technologies have been proposed for extracting (creating) differential data for generating, from old data, data identical to new data.

For example, with a technology described in Patent Document 1, old data is compared with new data in terms of byte to extract, as copy data (Move data), byte strings conforming to both the data, and to extract, as additional data, byte strings present only in the new data. And then differential data including a copy command (Move command) representing the extracted copy data and an addition command representing the extracted additional data is created.

The copy command does not include the copy data itself, but indicates a storage location and a size of the copy data in the old data. Normally, since a size of data containing a storage location and a size of copy data is rather smaller than a size of the copy data itself, the larger such copy data, the higher an effect of reducing differential data in size.

For example, the description here assumes that data obtained by inserting 1-byte insertion data B at a top of 32-byte old data A is new data C. That is, 33-byte data {B, A} is the new data C. In such a case, differential data extracted through the technology described in Patent Document 1 can include an addition command and a copy command described below.

Addition command (1 byte): Includes 1-byte additional data representing the insertion data B. In this regard, a value should take other than a delimiter (0x0F). Moreover, (0x**) should indicate a hexadecimal notation.

Copy command (2 bytes): Includes 1-byte delimiter (0x0F) representing a copy command, and 1-byte data (0x20) representing a size of the copy data (32 bytes). Since a top address of the copy data in the old data A is 0, no address field is required.

As a result, the differential data for generating, from the old data A, data identical to the new data C is 3-byte data, rather than 33-byte data, thus the differential data is reduced in size. Such an effect of reducing differential data in size becomes significant, in differential data, when copy data increases, but additional data reduces.

PRIOR ART DOCUMENTS

Patent Documents

Patent Document 1: Japanese Patent Application Laid-Open No. 2004-152136

SUMMARY OF INVENTION

Problems to be Solved by the Invention

Now, as long as data is indicated in terms of byte, and new data is generated by changing (for example, insertion and deletion) old data in terms of byte, such a technology described in Patent Document 1, through which a difference between the old data and the new data is extracted in terms of byte, is applicable. However, in view of reducing data, another technology is proposed, through which data is indicated in terms of a minimum number of bits, and new data is generated by changing old data in terms of bit.

With the proposed technology, for example, when only 1 bit is effective in 1-byte insertion data, data obtained by inserting 1-bit insertion data b into old data will be new data. As a specific example, a case will now be described herein, under an assumption that old data A is 32-byte, i.e. 256-bit, bit string data A, and new data D is 257-bit, bit string data D obtained by inserting the 1-bit insertion data b at a top of bit string data A.

The bit string data A (old data A) and the bit string data D (new data D) are respectively stored into a storage medium as described below in terms of byte from a bit at the top in order.

A: a1, a2, . . . , a32

D: d1, d2, . . . , d32, d33

In the new data D, a bit string equivalent to the old data A is, since the old data A is shifted by 1 bit due to the inserted insertion data b, $d_i \neq a_i$ (i=1, 2, . . . , 32).

In this case, since a result is $d_i \neq a_i$ (i=1, 2, . . . , 32) when a difference between the old data A and the new data D each stored in terms of byte is extracted in terms of byte as described in the technology of Patent Document 1, it can be thought that no copy data is extracted, but 33-byte additional data including d1 to d33 is extracted. As a result, since differential data for generating, from the old data A, data identical to the new data D is 33-byte data, the effect of reducing differential data in size could be lowered.

As described above, in a case when new data is data obtained by inserting insertion data in terms of bit into old data, there is a problem in the technology of Patent Document 1, because copy data decreases in differential data, while additional data increases, thus the effect of reducing differential data in size could be lowered.

In view of the above described problem, the present invention has an object to provide a technology capable of enhancing the effect of reducing differential data in size.

Means for Solving the Problems

A differential data creating apparatus according to the present invention is a differential data creating apparatus for creating differential data for generating, from old data, data identical to new data, and includes a processor to execute a program; and a memory to store the program which, when executed by the processor, performs processes of, generating a plurality of data by shifting either of the old data and the new data in a forward direction and a backward direction of its bit string by each of 0, 1, 2, . . . , n bit(s), extracting, based on the plurality of data generated and other non-shifted data, information on bit strings common to the old data and the new data as information on copy bit strings, extracting information on other bit strings than the copy bit strings in the new data as information on additional bit strings, and creating differential data based on the information on copy bit strings and the information on additional bit strings.

A differential data creating method according to the present invention is a differential data creating method for creating differential data for generating, from old data, data identical to new data, and generates a plurality of data by shifting either of the old data and the new data in a forward direction and a backward direction of its bit string by each of 0, 1, 2, ..., n bit(s), extracts, based on the plurality of data which is generated and the other non-shifted data, information on bit strings common to the old data and the new data as information on copy bit strings, extracts, from the new data, information on other bit strings than the copy bit strings as information on additional bit strings, and creates differential data based on the information on copy bit strings and the information on additional bit strings.

Effects of the Invention

With the present invention, from old data and new data, based on data shifted within a range of 0, 1, 2, ..., n bit(s) in a forward direction and a backward direction of a bit string and other non-shifted data, information on copy bit strings and information on additional bit strings are obtained. Therefore, even if a discrepancy occurs in terms of bit between the old data and the new data, in differential data, copy bit strings can be increased, while additional bit strings can be reduced. As a result, the effect of reducing differential data in size can be enhanced.

Objects, features, aspects, and advantages of the present invention will be apparent through a detailed description shown below with reference to the accompanying drawings.

BRIEF DESCRIPTION OF DRAWINGS

FIG. 1 is a block diagram illustrating a differential data creating device and a data updating device according to a first embodiment.

FIG. 4 is a block diagram illustrating an exemplary configuration of an information processing device according to the first embodiment.

FIG. 16 is a flowchart illustrating an exemplary operation of the difference extracting unit according to the first embodiment.

FIG. 17 is a view illustrating an exemplary configuration of information on intermediate copy bit strings, according to the first embodiment.

FIG. 18 is a view illustrating an exemplary configuration of information on copy bit strings, according to the first embodiment.

FIG. 19 is a view illustrating an exemplary configuration of information on additional bit strings, according to the first embodiment.

FIG. 29 is a view illustrating an exemplary extraction process for information on additional bit strings, according to the first embodiment.

FIG. 33 is a view illustrating an exemplary configuration of an end command according to the first embodiment.

FIG. 35 is a view illustrating an exemplary configuration of merge information, according to the first embodiment.

FIG. 36 is a flowchart illustrating an exemplary data updating operation according to the first embodiment.

FIG. 37 is a view illustrating an exemplary process of a data updating unit according to the first embodiment.

DESCRIPTION OF EMBODIMENTS

<First Embodiment>

Figure 2:
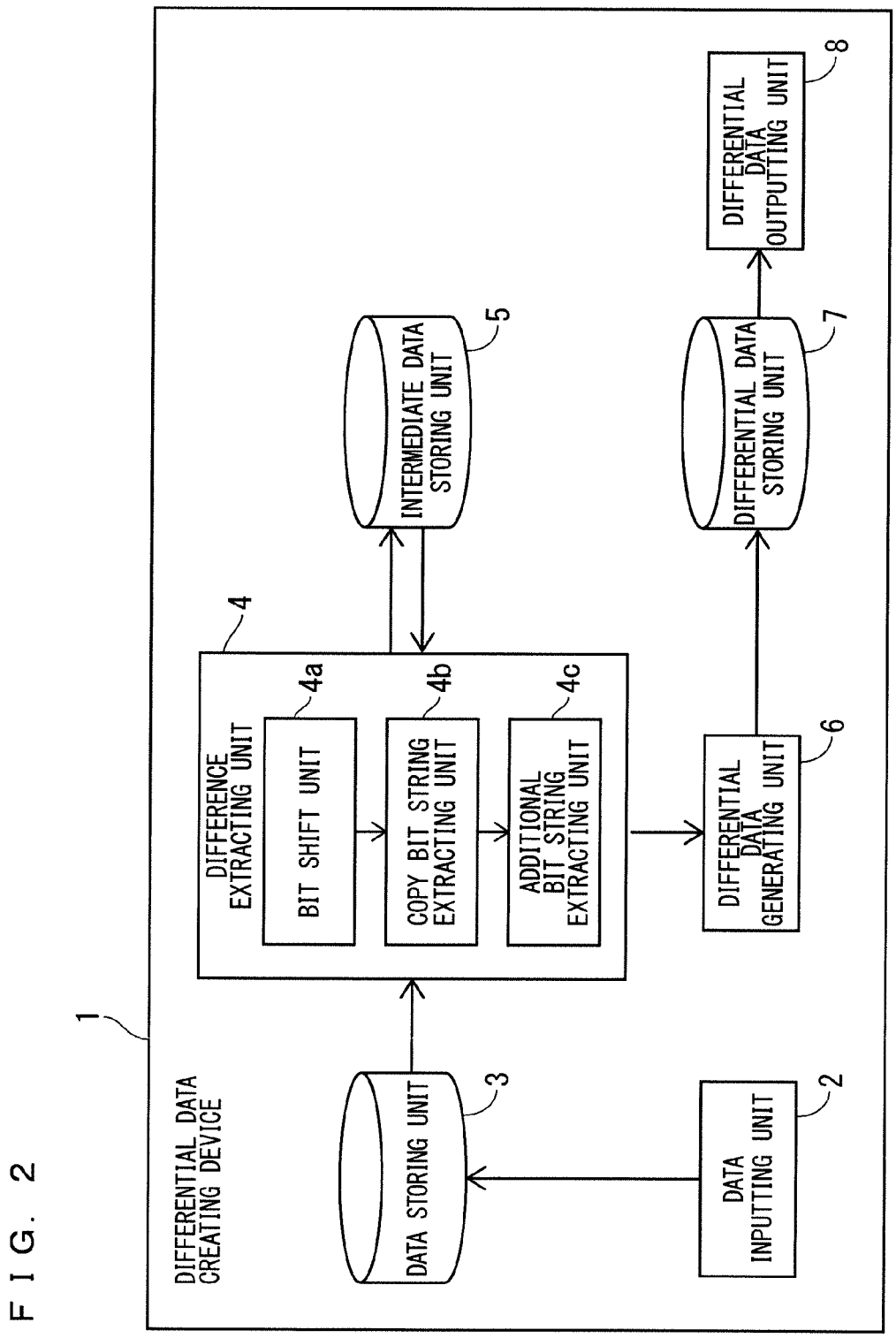
FIG. 2 is a block diagram illustrating an exemplary configuration of the differential data creating device according to the first embodiment.

In the below description, an example, in which a differential data creating system according to the present invention is applied to a single differential data creating device, and a data updating system according to the present invention is applied to a single data updating device, will now be described herein.

FIG. 1 is a block diagram illustrating a main configuration of a differential data creating device 1 according to the first embodiment of the present invention, and a data updating device 11 according to the first embodiment of the present invention. The differential data creating device 1 creates differential data for generating, from old data, data identical to new data. The old data and the new data are bit string data, where the new data is data obtained by changing (for example, insertion and deletion) the old data in terms of bit.

The differential data creating device 1 in FIG. 1 includes a bit shift unit 4a, a copy bit string extracting unit 4b, an additional bit string extracting unit 4c, a differential data generating unit 6, i.e. differential data creating unit.

The bit shift unit 4a shifts either of the old data and the new data in a forward direction and a backward direction of its bit string by each of 0, 1, 2, ..., n (n: natural number) bit(s) to generate a plurality of data.

At this point, for the forward direction of the bit string, for example, a data's bit stream direction, or a direction toward which data to be shifted heads from a top level bit to a bottom level bit, is applied. The backward direction of the bit string is a direction opposite to the forward direction of the bit string.

In the first embodiment, it is assumed that the above described n is 7, and data to be shifted is new data. That is, the bit shift unit 4a shifts the new data in a forward direction and a backward direction of its bit string by each of 0, 1, 2, ..., 7 bit(s) to generate a plurality of data (15 pieces of data in here).

The copy bit string extracting unit 4b extracts, based on the plurality of data generated by the bit shift unit 4a and other data that is not shifted by the bit shift unit 4a, information on bit strings common to the old data and the new data as information on copy bit strings (copy bit string information). In the first embodiment, since one data is the new data, other data as referred herein is the old data.

The additional bit string extracting unit 4c extracts information on other bit strings than copy bit strings from the new data as information on additional bit strings (additional bit string information).

The differential data generating unit 6 generates (creates) differential data based on the information on copy bit strings and the information on additional bit strings.

The data updating device 11 in FIG. 1 obtains differential data generated by the differential data creating device 1 from the differential data creating device 1. And then the data updating device 11 generates, based on the differential data and the old data, data identical to the new data.

<Differential Data Creating Device>

In here, not only main components of the differential data creating device 1, but also additional components will be described.

FIG. 2 is a block diagram illustrating a main configuration and an exemplary additional configuration of the differential data creating device 1 according to the first embodiment. The differential data creating device 1 in FIG. 2 includes a data inputting unit 2, a data storing unit 3, a difference extracting unit 4, an intermediate data storing unit 5, a differential data generating unit 6, a differential data storing unit 7, and a differential data outputting unit 8.

Into the data inputting unit 2, for example, old data and new data externally created by a data creating device (not shown) or other devices, or ,for example, old data and new data stored in a storage medium, such as semiconductor memory, Digital Versatile Disk (DVD) (not shown), are input.

The data storing unit 3 stores the old data and the new data input into the data inputting unit 2.

The difference extracting unit 4 includes the bit shift unit 4a, the copy bit string extracting unit 4b, and the additional bit string extracting unit 4c in FIG. 1. Therefore, the difference extracting unit 4 can shift the new data, extract information on copy bit strings, and extract information on additional bit strings. In here, the difference extracting unit 4 extracts the information on copy bit strings and the information on additional bit strings from the old data and the new data stored in the data storing unit 3.

The intermediate data storing unit 5 stores an interim result of extracting information on copy bit strings. At this point, the interim result corresponds to information on intermediate copy bit strings (intermediate copy bit string information) described later.

The differential data generating unit 6 is identical to the differential data generating unit 6 in FIG. 1, and generates differential data based on a result of extraction (information on copy bit strings and information on additional bit strings) by the difference extracting unit 4.

The differential data storing unit 7 stores the differential data generated by the differential data generating unit 6.

Figure 3:
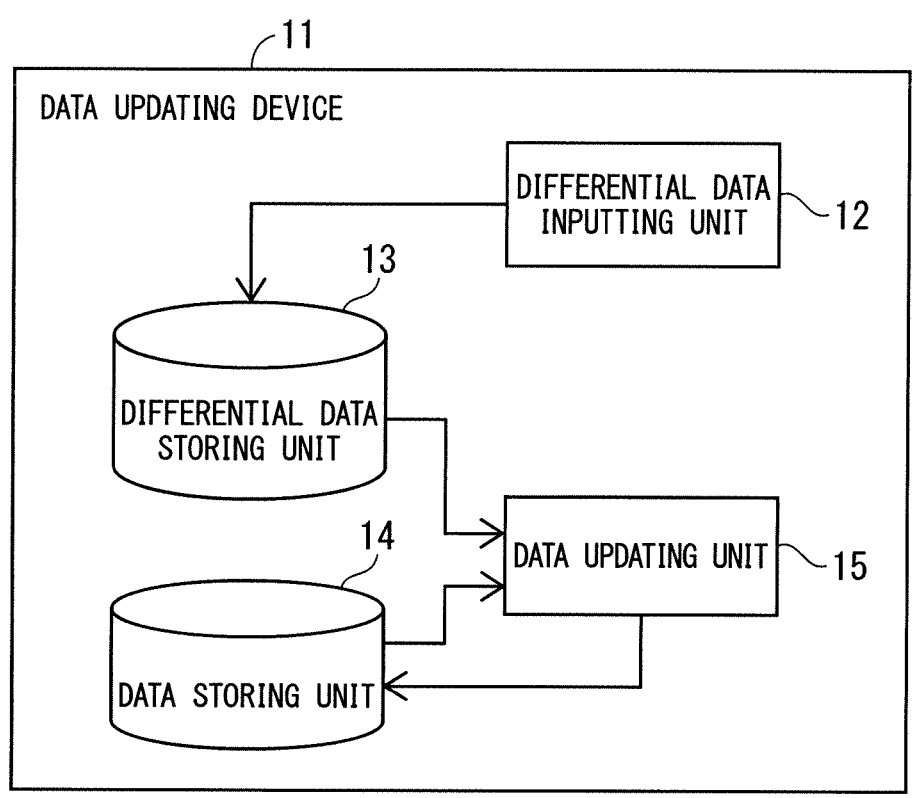
FIG. 3 is a block diagram illustrating an exemplary configuration of the data updating device according to the first embodiment.

The differential data outputting unit 8 stores the differential data stored in the differential data storing unit 7 into a storage medium such as semiconductor memory and DVD (not shown) to provide the differential data to the data updating device 11 in FIG. 3 or an information processing device 21 in FIG. 4, or, via a communication network (not shown), to the data updating device 11 in FIG. 3 or the information processing device 21 in FIG. 4.

Moreover, the data storing unit 3, the intermediate data storing unit 5, and the differential data storing unit 7 are configured to each include a storage device, for example, hard disk drive (HDD) or semiconductor memory (not shown). The difference extracting unit 4 and the differential data generating unit 6 are achieved, for example, when one or more Central Processing Unit(s) (CPU(s)) (not shown) of the differential data creating device 1 execute(s) a program stored in a storage device such as internal memory (not shown), as functions of the CPU(s).

<Data Updating Device>

FIG. 3 is a block diagram illustrating an exemplary configuration of the data updating device 11 according to the first embodiment. The data updating device 11 in FIG. 3 includes a differential data inputting unit 12, a differential data storing unit 13, a data storing unit 14, and a data updating unit 15.

Into the differential data inputting unit 12, differential data stored in a storage medium by the differential data creating device 1 is input, or, via a communication network, differential data is input by the differential data creating device 1. Moreover, into the differential data inputting unit 12, old data may be input externally.

The differential data storing unit 13 stores the differential data input into the differential data inputting unit 12.

The data storing unit 14 preliminarily stores old data. Moreover, when old data is input into the differential data inputting unit 12, the data storing unit 14 may store the old data.

The data updating unit 15 generates data identical to new data based on the old data stored in the data storing unit 14 and the differential data stored in the differential data storing unit 13.

The new data is stored into the data storing unit 14. The new data may be output into a storage medium, such as semiconductor memory and DVD, or may be output externally via a communication network.

Moreover, the differential data storing unit 13 and the data storing unit 14 are configured to each include, for example, a storage device, such as HDD and semiconductor memory (not shown). The data updating unit 15 is achieved, for example, when a CPU (not shown) of the data updating device 11 executes a program stored in a storage device such as internal memory (not shown), as a function of the CPU.

<Information Processing Device>

FIG. 4 is a block diagram illustrating an exemplary configuration of the information processing device 21 according to the first embodiment. The information processing device 21 in FIG. 4 includes a differential data inputting unit 22, a differential data storing unit 23, a data storing unit 24, a data updating unit 25, a position detecting unit 26, an operation inputting unit 27, an information processing unit 28, and a displaying unit 29. This information processing device 21 internally includes a configuration similar or identical to a configuration (the differential data inputting unit 12, the differential data storing unit 13, the data storing unit 14, and the data updating unit 15) of the data updating device 11 in FIG. 3 so as to perform various information processes using new data obtained through the configuration.

The data storing unit 24 stores old map information (old data). In addition, the data storing unit 24 stores new map information (new data) obtained through the above described updating.

The position detecting unit 26 detects a position of a moving body or a communication terminal (for example, potable terminal such as cellular phone, smartphone, and tablet) mounted with the information processing device 21. The position detecting unit 26 is configured to include, for example, a GPS receiver receiving a GPS signal from a Global Positioning System (GPS) satellite.

The operation inputting unit 27 receives various operations to the information processing device 21, such as a destination specification operation, from a user or other operator.

The information processing unit 28 follows the user's operation received by the operation inputting unit 27 to obtain, based on the position detected by the position detecting unit 26, necessary map information from the data storing unit 24 to display, on the displaying unit 29, a map specified by the map information and the position detected by the position detecting unit 26. In addition, the information processing unit 28 also searches for a route from a current position (position detected by the position detecting unit 26) to a destination, guides the route, and performs other navigation processes.

The map information includes information representing road networks using nodes representing intersections and links representing roads connecting the intersections, and includes information representing geographical features. Numbers of nodes and links differ depending on a region, thus, a maximum value of identification numbers to be applied for identifying nodes and links differs depending on the region. In addition, road shapes and geographical features are rendered using changes in shape, thus, the changes in shape differ depending on road characteristics and geographical features. Therefore, in the map information, a necessary minimum field length for representing each element relatively largely differs, thus, when each element is represented with a field having a length in terms of byte or in terms of word, a data size would increase more than necessary. Accordingly, as a style for reducing map information in data size, a style, where a field representing each element has a variable length in terms of bit, and a field length can be changed to a minimum necessary length, is advantageous.

With the differential data creating device 1 according to the first embodiment, for data to be changed in terms of bit, such as the above described map information, differential data described above can be reduced in size.

<Old Data and New Data>

The description here assumes that old data and new data applied to map information and other information are data including a bit string arranged with a plurality of bits, i.e. bit string data. The bits in the bit string are each identified, using a bit address. In here, a bit address represents a position of a bit counted from a top bit in bit string data, and is applied with a number, such as 0, 1, 2, . . . , in order from the top bit.

Figure 5:
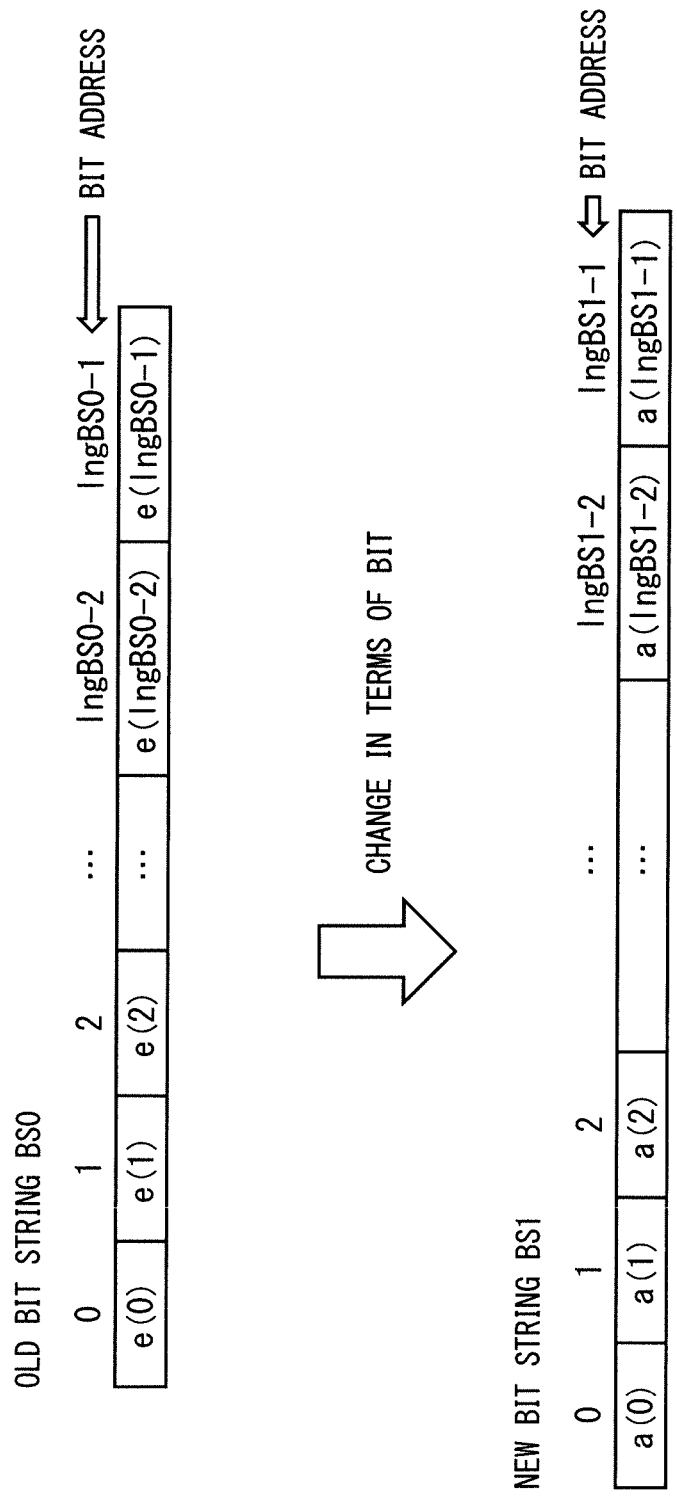
FIG. 5 is a view illustrating an exemplary configuration of old data and new data, according to the first embodiment.

FIG. 5 is a view illustrating an exemplary configuration of old data and new data, according to the first embodiment.

In a bit string of old data (old bit string BS0) shown in FIG. 5, bits each applied with a value of either 0 or 1 are arranged, as described below, from a top (top level bit) to an end (bottom level bit) in order.

e(0), e(1), e(2), . . . e(lngBS0-1)

e(p): Bit with bit address p (p=0, 1, 2, . . . , lngBS0-1)

lngBS0: Bit string length of old bit string BS0

A bit string of new data (new bit string BS1) shown in FIG. 5 is a bit string where a change, such as deletion, insertion, replacement, and addition, is performed to data in the old bit string BS0 in terms of bit. In this new bit string BS1, bits each applied with a value of either 0 or 1 are also arranged, as described below, from a top (top level bit) to an end (bottom level bit) in order.

a(0), a(1), a(2), . . . a(lngBS1-1)

a(p): Bit with bit address p (p=0, 1, 2, . . . , lngBS1-1)

lngBS1: Bit string length of new bit string BS1

Figure 6:
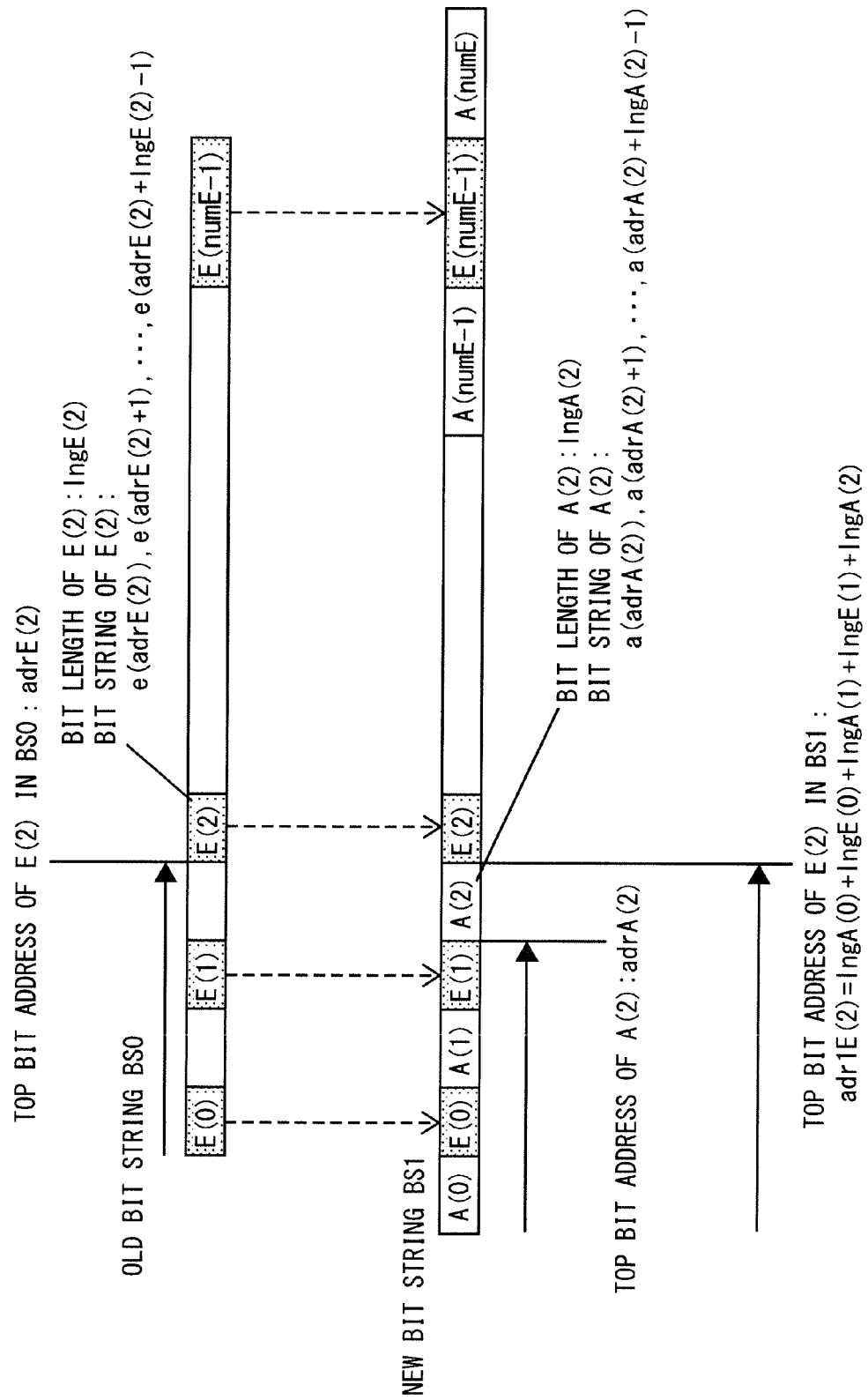
FIG. 6 is a view illustrating a relationship between old data and new data, according to the first embodiment.

FIG. 6 is a view illustrating a relationship between old data and new data, according to the first embodiment.

The new bit string BS1 includes a partial bit string (hereinafter referred to as "copy bit string") E(i) common to the old bit string BS0, and a partial bit string (hereinafter referred to as "additional bit string") A(i) newly generated through a change, thus is not common to the old bit string BS0. The new bit string BS1 can be represented, for example, as described below, by an array of the copy bit string E(i) and the additional bit string A(i).

A(0), E(0), A(1), E(1), . . . A(numE-1), E(numE-1), A(numE)

A(i): Additional bit string newly generated through a change (i=0, 1, . . . , numE)

Moreover, a bit length of A(i) may be 0.

E(i): Copy bit string common to new bit string BS1 and old bit string BS0 (i=0, 1, . . . , numE-1)

numE: Number of copy bit strings

An array of bits in each of the copy bit strings E(i) is as described below. In the below description, a bit address adrE(i) of a top of the copy bit string E(i) in the old bit string BS0 is described. A bit address of a top of the copy bit string E(i) in the new bit string BS1 will be described later.

e(adrE(i)), e(adrE(i)+1), e(adrE(i)+2), . . . , e(adrE(i)+lngE(i)-1)

e(p): Bit with bit address p in old bit string BS0 (adrE(i)≤p≤adrE(i)+lngE(i)-1)

adrE(i): Bit address of top of copy bit string E(i) in old bit string BS0 lngE(i): Bit string length of copy bit string E(i) (>0)

An array of bits in the additional bit string A(i) is as described below. Moreover, although the copy bit string E(i) is present in the old bit string BS0 and the new bit string BS1, the additional bit string A(i) is only present in the new bit string BS1.

a(adrA(i)), a(adrA(i)+1), a(adrA(i)+2), . . . , a(adrA(i)+lngA(i)−1)

a(p): Bit with bit address p in new bit string BS1 (adrA(i)≤p≤adrA(i)+lngA(i)−1)

adrA(i): Bit address of top of additional bit string A(i) in new bit string BS1 lngA(i): Bit string length of additional bit string A(i) (≥0)

Once the copy bit string E(i) in the old bit string BS0 (old data) is copied, and the additional bit string A(i) is added, the new bit string BS1 (new data) is obtained. In light of the above, differential data will be generated so as to include information regarding the copy bit string E(i) and the additional bit string A(i).

Moreover, as a change from old data to new data, at least one of deletion, insertion, replacement, and addition is expected. Such exemplary changes are shown in FIGS. 7 to 11.

Figure 7:
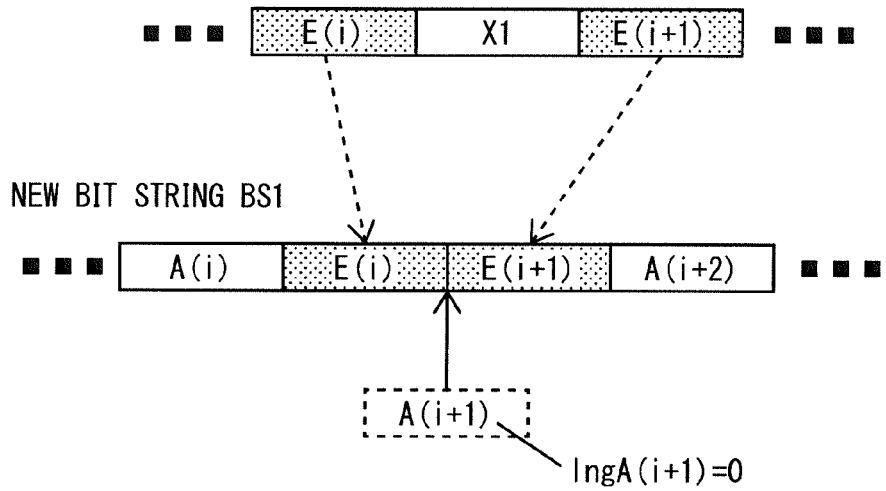
FIG. 7 is a view illustrating an example of change from old data to new data, according to the first embodiment.

FIG. 7 is a view illustrating an example when a partial bit string X1 present between a copy bit string E(i) and a copy bit string E(i+1) in an old bit string BS0 is deleted. In this regard, in a new bit string BS1, it is assumed that a bit length of an additional bit string A(i+1) is 0.

Figure 8:
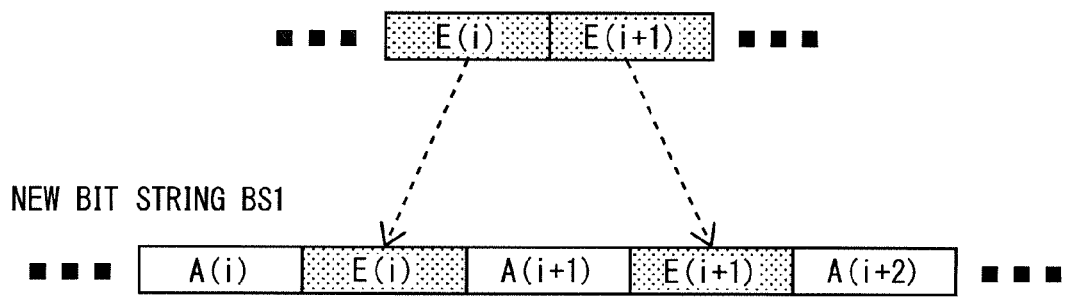
FIG. 8 is a view illustrating an example of change from old data to new data, according to the first embodiment.

FIG. 8 is a view illustrating an example when an additional bit string A(i+1) is added between a copy bit string E(i) and a copy bit string E(i+1) in an old bit string BS0.

Figure 9:
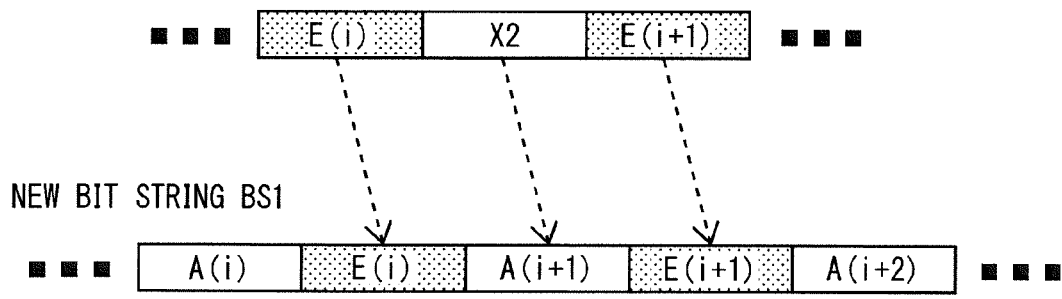
FIG. 9 is a view illustrating an example of change from old data to new data, according to the first embodiment.

FIG. 9 is a view illustrating an example when a partial bit string X2 present between a copy bit string E(i) and a copy bit string E(i+1) in an old bit string BS0 is replaced with an additional bit string A(i+1).

Figure 10:
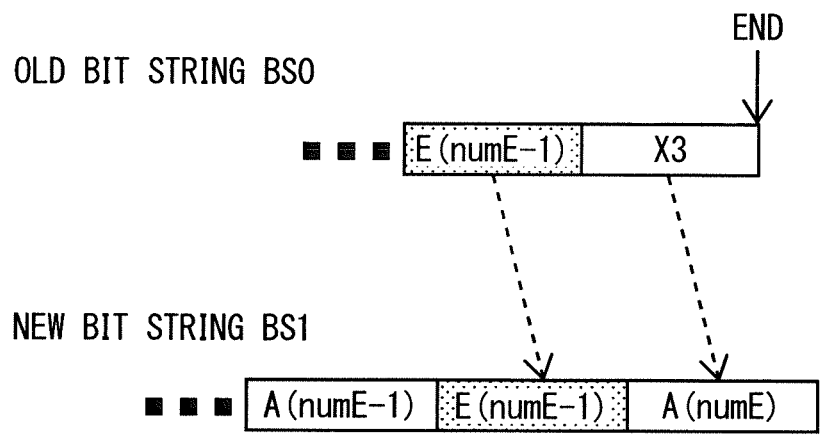
FIG. 10 is a view illustrating an example of change from old data to new data, according to the first embodiment.

FIG. 10 is a view illustrating an example when a partial bit string X3 including an end of an old bit string BS0 is replaced with an additional bit string A(numE).

Figure 11:
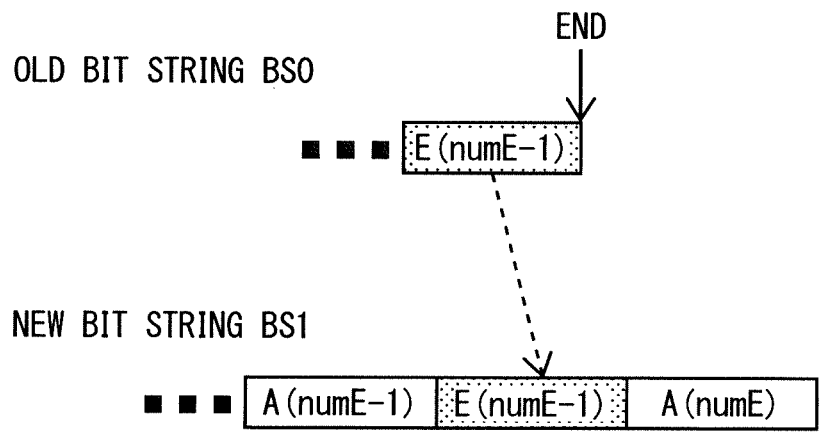
FIG. 11 is a view illustrating an example of change from old data to new data, according to the first embodiment.

FIG. 11 is a view illustrating an example when an additional bit string A(numE) is added at an end of an old bit string BS0.

When one of the changes as described above is performed, in many cases, a bit address of a copy bit string E(i) in a new bit string BS1 could shift from bit addresses in an old bit string BS0. Although a bit address of a top of the copy bit string E(i) in the old bit string BS0 is the above described bit address adrE(i), the bit address in the new bit string BS1 will be a bit address adr1E(i) obtained by an equation (1) shown below.

[Equation 1]

$$adr1E(i) = \sum_{j=0}^{i-1} \{lngA(j) + lngE(j)\} + lngA(i) \quad (1)$$

In FIG. 6, as an exemplary bit address adr1E(i), a bit address adr1E(2) of a top of a copy bit string E(2) in the new bit string BS1 is shown.

<File Of Bit String Data>

An old bit string BS0 and a new bit string BS1 will respectively be stored as, for example, a file F0 and a file F1 into the data storing unit 3.

Figure 12A:
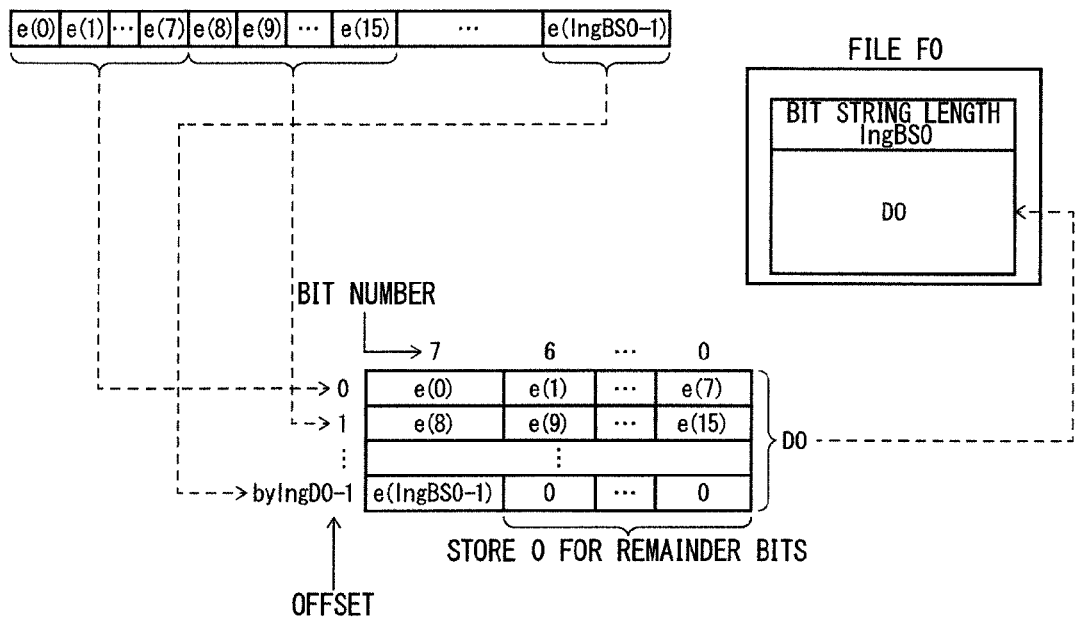
FIGS. 12A and 12B are views illustrating an exemplary configuration of old data and new data, according to the first embodiment.
Figure 12B:
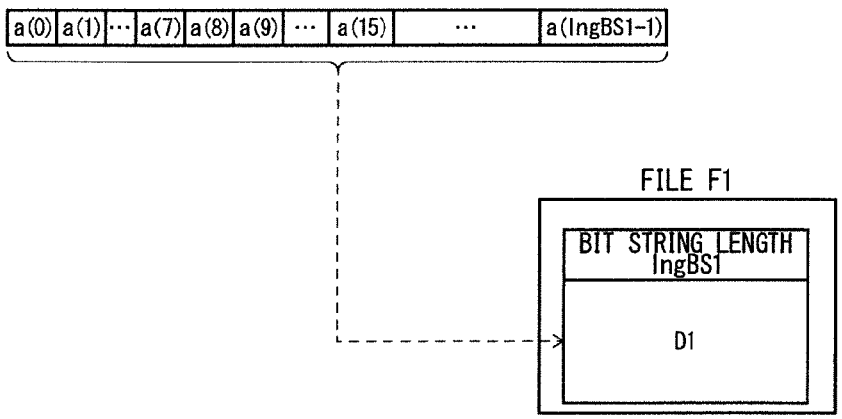

FIGS. 12A and 12B are views illustrating an example when the old bit string BS0 and the new bit string BS1 are respectively stored as the file F0 and the file F1.

At a top of the file F0, a bit string length lngBS0 representing a bit string length of the old bit string BS0 is stored as a 32-bit non-negative integer, and, immediately after that, data D0 corresponding to the old bit string BS0 is stored in a matrix manner. The old bit string BS0 is stored per 8 bits from a top bit in order as data having a bylngD0 (=lngBS0/8. A remainder is rounded up.) byte. Moreover, for remainder bits in a final 1 byte, 0 is each stored.

In a similar or identical manner as described above, the new bit string BS1 is stored as the file F1. That is, a bit string length lngBS1 of the new bit string BS1 is stored as a 32-bit non-negative integer, and, immediately after that, data D1 corresponding to the new bit string BS1 is stored in a matrix manner. The new bit string BS1 is stored per 8 bits from a top bit in order as data having a bylngD1 (=lngBS1/8. A remainder is rounded up.) byte. Moreover, for remainder bits in a final 1 byte, 0 is each stored.

Each byte in the data D0 and D1 is identified, using an offset. At this point, an offset represents a position of a subject byte, counted from a top byte in the data D0 or the data D1. The offset is applied with, for example, a number in an order of 0, 1, 2, . . . from a top byte.

Each bit in each byte in the data D0 and D1 is identified, using a bit number. At this point, a bit number represents a position of a subject bit in 8 bits configuring a byte. Bit numbers are applied, for example, to bits from a top level to a bottom level (in a forward direction of a bit string) in an order of 7, 6, 5, 4, 3, 2, 1, and 0.

Figure 13:
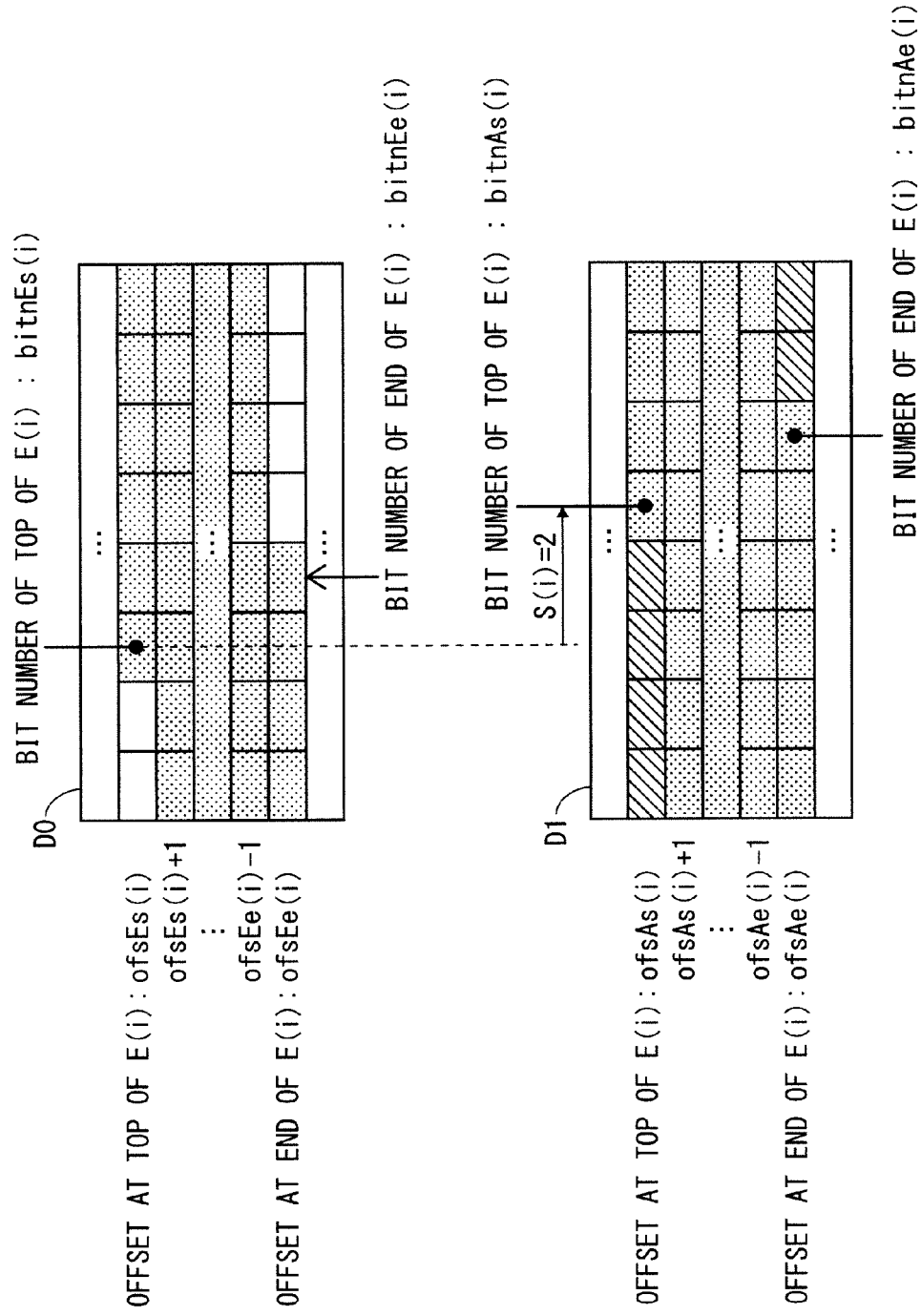
FIG. 13 is a view illustrating an exemplary configuration of old data and new data, according to the first embodiment.

FIG. 13 is a view illustrating an example of the copy bit string E(i) (FIG. 6) in data D0 and D1. In FIG. 13, sand-hatching portions correspond to copy bit strings, and oblique-line-hatching portions correspond to additional bit strings.

As described above, since bit addresses used by the copy bit string E(i) in an old bit string BS0 are adrE(i) to adrE(i)+lngE(i)−1, offsets and bit numbers for bits at a top and an end of the copy bit string E(i) in the old bit string BS0 are as described below. Moreover, in the below description, "/" represents an arithmetic operation for calculating a quotient in a division, while "%" represents an arithmetic operation for calculating a remainder in a division.

Offset at top bit in copy bit string E(i): ofsEs(i)=adrE(i)/8

Bit number of top bit in copy bit string E(i): bitnEs(i)=7−adrE(i)%8

Offset at end bit in copy bit string E(i): ofsEe(i)=(adrE(i)+lngE(i)−1)/8

Bit number of end bit in copy bit string E(i): bitnEe(i)=7−(adrE(i)+lngE(i)−1)%8

As described above, since bit addresses used in the copy bit string E(i) in the new bit string BS1 are adr1E(i) to adr1E(i)+lngE(i)−1, offsets and bit numbers for bits at a top and an end of the copy bit string E(i) in the new bit string BS1 are as described below.

Offset at top bit in copy bit string E(i): ofsAs(i)=adr1E(i)/8

Bit number of top bit in copy bit string E(i): bitnAs(i)=7−adr1E(i)%8

Offset at end bit in copy bit string E(i): ofsAe(i)=(adr1E(i)+lngE(i)−1)/8

Bit number of end bit in copy bit string E(i): bitnAe(i)=7−(adr1E(i)+lngE(i)−1)%8

Bit addresses in the copy bit string E(i) included in the data D1 are each shifted, compared with bit addresses in the copy bit string E(i) included in the data D0, when a difference in offset is excluded, by a bit of S(i) described below.

S(i)=bitnAs(i)−bitnEs(i)

A case when S(i)>0 means that the copy bit string E(i) in the new bit string BS1 is shifted, regarding the copy bit string E(i) in the old bit string BS0, toward an end of the new bit string BS1 (forward direction of the bit string). A case when S(i)<0 means that the copy bit string E(i) in the new bit string BS1 is shifted, regarding the copy bit string E(i) in the old bit string BS0, toward a top of the new bit string BS1 (backward direction of the bit string). A case when S(i)=0 means that there is no shift.

In addition, 0≤bitnAs(i)<8, and 0 bitnEs(i) <8, thus 0 |S(i)|<8. That is, when a difference in offset is ignored, the bit addresses in the copy bit string E(i) in the data D1 are, compared with the bit addresses in the copy bit string E(i) in the data D0, either not shifted in terms of bit, shifted in the direction toward the end (forward direction of the bit string) by 1 to 7 bit(s), or shifted in the direction toward the top (backward direction of the bit string) by 1 to 7 bit(s).

Moreover, in the example in FIG. 13, S(i)=2, i.e. the copy bit string E(i) in the new bit string BS1 is shifted, regarding the copy bit string E(i) in the old bit string BS0, by only 2 bits toward the end of the new bit string BS1 (forward direction of the bit string).

Now, in a case when S(i)=0, or in a special case when an identical value continues, a byte string with an offset in a range from ofsEs(i) to ofsEe(i) in the data D0 conforms to a byte string with an offset in a range from ofsAs(i) to ofsAe(i) in the data D1. However, normally, since a shift in terms of bit as described above should present, these byte strings do not conform in many cases.

Regardless of the above, in conventional technologies, while a copy bit string E(i) in data D0 and a copy bit string E(i) in data D1 are kept shifted in terms of bit, a difference in terms of byte is obtained. Therefore, the copy bit string E(i) with an offset in a range from ofsEs(i) to ofsEe(i) cannot be extracted, while, in differential data, copy bit strings decrease, but additional bit strings increase in many cases. As a result, a problem on decrease in the effect of reducing differential data in size has been present.

In contrast, the differential data creating device 1 according to the first embodiment can, as it will be apparent with the below description, increase copy bit strings in differential data, and reduce additional bit strings, thus the effect of reducing differential data in size can be enhanced.

<Summary of Extracting Copy Bit Strings and Additional Bit Strings>

Figure 14:
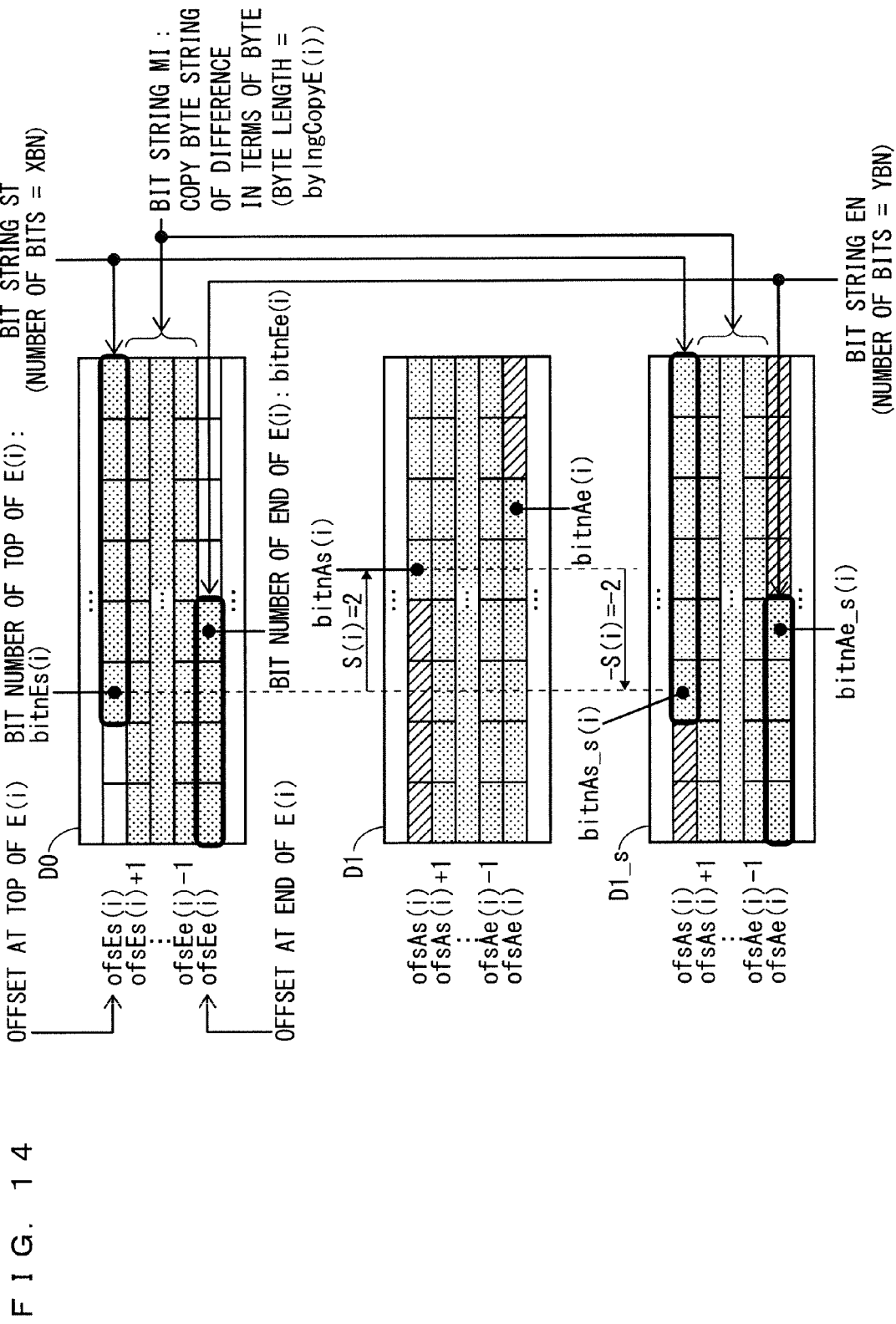
FIG. 14 is a view illustrating an exemplary process of the differential data creating device according to the first embodiment.

FIG. 14 is a view illustrating an exemplary process for extracting the copy bit string E(i) in FIG. 6 by the differential data creating device 1. Data D1_s is data where each bit in data D1 is shifted in a forward direction of a bit string by a bit of −S(i)(=−2), i.e. data shifted in a backward direction of the bit string by only 2 bits. Moreover, although a shift amount (−S(i) in here) suitable for shifting the data D1 is unknown, an action to be taken for this will be described later in detail, but, in here, the description will be given under an assumption that such a suitable shift amount is known.

As shown in FIG. 14, by the shift, a discrepancy between a byte string with an offset in a range from ofsEs(i) to ofsEe(i) in data D0 and a byte string with an offset in a range from ofsAs(i) to ofsAe(i) in the data D1_s is removed.

When a difference is obtained by performing a comparison in terms of byte similarly or identically to a conventional method, the data D0 with the data D1_s in which a discrepancy in terms of bit is removed, at least byte strings with an offset in a range from ofsEs(i)+1 to ofsEe(i)−1 in the data D0 will be extracted as copy bit strings. In the below description, a bit string forming a byte string in this offset range is specified to a bit string MI.

As shown in FIG. 14, in the data D1 (new data), a byte string with an offset ofsAs(i), i.e. a byte string including a bit string at a top portion of the copy bit string E(i), can include an oblique-line-hatching additional bit string. Therefore, an entire byte string with an offset ofsEs(i) in the data D0 does not sometimes conform in terms of byte to an entire byte string with an offset ofsAs(i) in the data D1_s. As a result, in a comparison and a difference in terms of byte, it can be thought that a bit string at the top portion of the copy bit string E(i), i.e. a bit string ST surrounded by a bold line in FIG. 14, will not sometimes be extracted.

This can also be applied to a bit string at an end portion of the copy bit string E(i). That is, an entire byte string with an offset ofsEe(i) in the data D0 does not sometimes conform in terms of byte to an entire byte string with an offset ofsAe(i) in the data D1_s. As a result, in a comparison and a difference in terms of byte, it can be thought that the bit string at the end portion of the copy bit string E(i), i.e. a bit string EN surrounded by a bold line in FIG. 14, will not be extracted.

Accordingly, with the first embodiment, the difference extracting unit 4 obtains, for the byte string with the offset ofsEs(i) in the data D0 and the byte string with the offset ofsAs(i) in the data D1_s, a difference by performing a comparison in terms of bit, rather than in terms of byte. Therefore, the bit string ST surrounded by a bold line in FIG. 14, which could not be extracted in a comparison and a difference in terms of byte, can be extracted.

In a similar or identical manner, the difference extracting unit 4 obtains, also for the byte string with the offset ofsEe(i) in the data D0 and the byte string with the offset ofsAe(i) in the data D1_s, a difference by performing a comparison in terms of bit, rather than in terms of byte. Therefore, the bit string EN surrounded by a bold line in FIG. 14, which could not be extracted in a comparison and a difference in terms of byte, can be extracted.

By combining the above described bit strings MI, the bit string ST, and the bit string EN, the copy bit string E(i) in FIG. 6 can be extracted.

Now, as described above, although a shift amount suitable for shifting the data D1 is unknown, 0<|S(i)|<8. In light of this, the bit shift unit 4a of the difference extracting unit 4 shifts the data D1 by each bit from −7 bits to 7 bits to generate a plurality of (15 in here) data D1_s (s=−7 to 7). Between any of the plurality of data D1_s generated in such a manner and the data D0, a discrepancy of the copy bit strings E(i) can be removed.

At this point, in the data D0 and the data D1_s (s=−7 to 7), common bit strings are assumed to be bit strings described below.

CopyBS_s_0, CopyBS_s_1, . . . , CopyBS_s_Z(s)

Z(s): Number obtained by subtracting 1 from a number of copy bit strings in the data D1_s, with respect to the data D0

In any of bit shift amount s=−7 to 7, CopyBS_s_z (z=0, 1, . . . , Z(s)) almost conforms to the copy bit string E(i).

In this regard, as a special case, when an identical value continues in a part of the copy bit string E(i), not only CopyBS_s_z that perfectly conforms to the copy bit string E(i) is obtained, but also another CopyBS_s_z that partially conforms to the copy bit string E(i) can sometimes be obtained. In addition, depending on values before and after the copy bit string E(i) in the data D1_s, the bit string ST or the bit string EN (FIG. 14) can include another bit than the copy bit string E(i), and, in this case, CopyBS_s_z that is larger than the copy bit string E(i) can sometimes be obtained.

In these cases, in the bit shift amount s=−7 to 7 in whole, a plurality of CopyBS_s_z can include a duplicated portion.

Accordingly, the difference extracting unit 4 according to the first embodiment does not extract, as the copy bit string E(i), CopyBS_s_z extracted as described above, but generates (extracts) CopyBS_s_z as an intermediate copy bit string for generating (extracting) the copy bit string E(i). CopyBS_s_z is a bit string of the data D1_s, in which bits are kept shifted by the bit shift unit 4a. Therefore, CopyBS_s_z that is shift in a backward direction by an amount of the shift, i.e. CopyBS_s_z that is corrected so as to restore to a bit string in the data D1, will now be described herein, as an intermediate copy bit string.

As described above, after a plurality of intermediate copy bit strings has been created, the difference extracting unit 4 generates (extracts) information on bit strings including at least either of an intermediate copy bit string that does not duplicate each other in a plurality of intermediate copy bit strings, and a bit string obtained by joining intermediate copy bit strings that duplicate each other in the plurality of intermediate copy bit strings, as final information on copy bit strings.

After that, the difference extracting unit 4 extracts a bit string obtained by excluding a copy bit string from the data D1 (new data), as an additional bit string. In the new bit string BS1 (data D1) in FIG. 6, when E(i) (i=1, 2, . . . ) is obtained as a copy bit string, A(i) (i=1, 2, . . . ) is extracted as an additional bit string.

<Detailed Configuration of Difference Extracting Unit and Differential Data Generating Unit>

Figure 15:
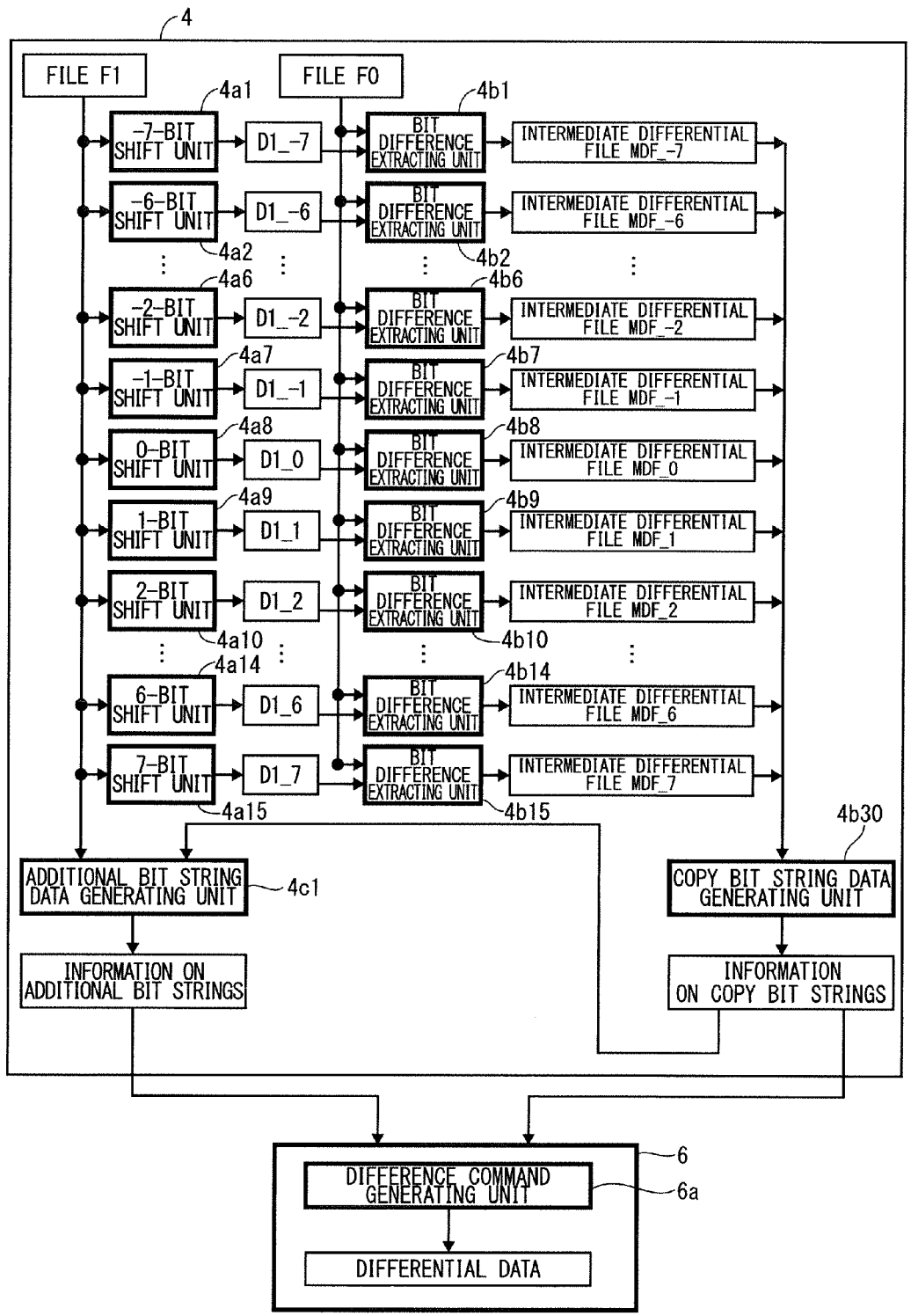
FIG. 15 is a block diagram illustrating an exemplary configuration of a difference extracting unit and a differential data generating unit according to the first embodiment.

FIG. 15 is a block diagram illustrating a detailed exemplary configuration of the difference extracting unit 4 and the differential data generating unit 6 according to the first embodiment.

The difference extracting unit 4 in FIG. 15 includes a −7-bit shift unit 4a1, a −6-bit shift unit 4a2, . . . , and a 7-bit shift unit 4a15, bit difference extracting units 4b1, 4b2, . . . , and 4b15, a copy bit string data generating unit 4b30, and an additional bit string data generating unit 4c1. The differential data generating unit 6 in FIG. 15 includes a difference command generating unit 6a.

Moreover, the bit shift unit 4a in FIG. 2 includes the −7-bit shift unit 4a1 to the 7-bit shift unit 4a15 in FIG. 15. The copy bit string extracting unit 4b in FIG. 2 includes the bit difference extracting units 4b1 to 4b15 (intermediate copy bit string extracting unit), and the copy bit string data generating unit 4b30 (final copy bit string extracting unit) in FIG. 15. The additional bit string extracting unit 4c in FIG. 2 includes the additional bit string data generating unit 4c1 in FIG. 15.

The −7-bit shift unit 4a1 to the 7-bit shift unit 4a15 shift new data (data D1 in the file F1) by −7 to 7 bit(s). That is, the −7-bit shift unit 4a1 to the 7-bit shift unit 4a15 shift the new data in a forward direction and a backward direction of its bit string by each of 0, 1, 2, . . . , 7 bit(s) to generate a plurality of (15 in here) data D1_−7 to D1_7. The plurality of data D1_−7 to D1_7 is stored in an internal memory (not shown).

The bit difference extracting unit 4b1 compares, in terms of bit and in terms of byte, the data D1_−7 with non-shifted old data (data D0 in the file F0). And then the bit difference extracting unit 4b1 extracts, through the comparison, information on bit strings common to the data D1_−7 and the old data as information on intermediate copy bit strings. The bit difference extracting unit 4b1 stores the extracted information on intermediate copy bit strings, as an intermediate differential file MDF_−7, into the intermediate data storing unit 5 (FIG. 2).

In a similar or identical manner, the bit difference extracting units 4b2 to 4b15 compare, in terms of bit and in terms of byte, a plurality of data D1_−6 to D1_7 with the non-shifted old data (data D0 in the file F0). And then the bit difference extracting units 4b2 to 4b15 extract, through the comparison, information on bit strings common to the plurality of data D1_−6 to D1_7 and the old data as a plurality of information on intermediate copy bit strings. And then the bit difference extracting units 4b2 to 4b15 store the extracted plurality of information on intermediate copy bit strings, as inten iediate differential files MDF_−6 to MDF_7, respectively, into the intermediate data storing unit 5 (FIG. 2).

The copy bit string data generating unit 4b30 obtains, based on the intermediate differential files MDF_−7 to MDF_7 extracted by the bit difference extracting units 4b1 to 4b15, information on bit strings including at least either of an intermediate copy bit string that does not duplicate each other in intermediate copy bit strings, and a bit string obtained by joining intermediate copy bit strings that duplicate each other in intermediate copy bit strings in these files, as information on copy bit strings. The copy bit string data generating unit 4b30 stores the obtained information on copy bit strings into the internal memory (not shown).

The additional bit string data generating unit 4c1 excludes copy bit strings from the data D1 (new data) in the file F1 to obtain information on remaining bit strings as information on additional bit strings. The additional bit string data generating unit 4c1 stores the obtained information on additional bit strings into the internal memory (not shown).

The difference command generating unit 6a generates differential data based on the information on additional bit strings and the information on copy bit strings. The generated differential data is stored in the differential data storing unit 7 (FIG. 2).

Moreover, by a CPU (not shown) of the differential data creating device 1, each process of the −7-bit shift unit 4a1 to the 7-bit shift unit 4a15, and the bit difference extracting units 4b1 to 4b15 may be performed in order (sequentially). Or, a plurality of CPUs (not shown) of the differential data creating device 1 may each be allocated to the −7-bit shift unit 4a1 to the 7-bit shift unit 4a15, and the bit difference extracting units 4b1 to 4b15 so that each process is performed in parallel. In addition, for example, by allocating CPUs one by one to each of those with shift amounts of −7 to 7 bit(s), processes of the bit shift units and bit difference extracting units for each of those with the shift amounts may be performed in parallel.

<Operation of Difference Extracting Unit>

FIG. 16 is a flowchart illustrating an exemplary operation of the difference extracting unit 4. In here, the exemplary operation through which processes of the −7-bit shift unit 4a1 to the 7-bit shift unit 4a15, and the bit difference extracting units 4b1 to 4b15 are performed in order (sequentially) will now be described. That is, an exemplary operation through which the bit shift unit 4a (FIG. 2) of the difference extracting unit 4 performs the processes of the −7-bit shift unit 4a1 to the 7-bit shift unit 4a15 in FIG. 15 in order, while the copy bit string extracting unit 4b (FIG. 2) of the difference extracting unit 4 performs the processes of the bit difference extracting units 4b1 to 4b15 in FIG. 15 in order will now be described.

First, in step S1, the difference extracting unit 4 reads, from the data storing unit 3, and stores, into the internal memory, the bit string length lngBS0 and the data D0 in the file F0 (FIGS. 12A and 12B).

In step S2, the difference extracting unit 4 reads, from the data storing unit 3, and stores, into the internal memory, the bit string length lngBS1 and the data D1 in the file F1 (FIGS. 12A and 12B).

In step S3, the difference extracting unit 4 sets a bit shift amount s provided in the internal memory to −7 for initialization.

In step S4, the bit shift unit 4a (−7-bit shift unit 4a1 to 7-bit shift unit 4a15) shifts bits of the data D1 by only the bit shift amount s, and stores data D1_s obtained through the bit shift into the internal memory. Moreover, when s=0, data D1_0 is non-shifted data D1.

In step S5, the copy bit string extracting unit 4b (bit difference extracting units 4b1 to 4b15) performs a comparison, based on the data D0 and the data D1_s, in terms of bit and in terms of byte to extract information on intermediate copy bit strings. The copy bit string extracting unit 4b stores the information on intermediate copy bit strings, as an intermediate differential file MDF_s, into the intermediate data storing unit 5.

FIG. 17 is a view illustrating an exemplary configuration of information on intermediate copy bit strings (intermediate differential file MDF_s).

The information on intermediate copy bit strings includes a number of intermediate copy bit string records, and intermediate copy bit string records corresponding to an amount indicated by the number of intermediate copy bit string records. Each of the intermediate copy bit string records includes fields for an intermediate copy destination bit address, an intermediate copy source bit address, and an intermediate copy bit string length. At this point, the intermediate copy destination bit address represents a bit address of an intermediate copy bit string in the data D1 (new data), the intermediate copy source bit address represents a bit address of the intermediate copy bit string in the data D0 (old data), and the intermediate copy bit string length represents a bit length of the intermediate copy bit string.

In step S6 in FIG. 16, the difference extracting unit 4 determines whether or not the bit shift amount s is 7. When the difference extracting unit 4 determines that the bit shift amount s is 7, the difference extracting unit 4 determines that a bit shift process ends, and allows the process to proceed to step S8, and if not, causes the process to proceed to step S7.

In step S7, the difference extracting unit 4 adds 1 to a value of the bit shift amount s to update the bit shift amount s. After that, the process returns to step S4.

When the process proceeds from step S6 to step S8, the copy bit string extracting unit 4b (copy bit string data generating unit 4b30) extracts, based on the intermediate differential file MDF_s (s=−7 to 7), final information on copy bit strings, and stores the information on copy bit strings into the internal memory.

FIG. 18 is a view illustrating an exemplary configuration of the final information on copy bit strings.

The information on copy bit strings includes a number of copy bit string records, and copy bit string records corresponding to an amount indicated by the number of copy bit string records. Each of the copy bit string records includes fields for a record identifier, a copy destination bit address, a copy source bit address, and a copy bit string length. At this point, the record identifier is a field for indicating that the record is a copy bit string record, and stores a value of 1. The copy destination bit address represents a bit address of a top bit in a copy bit string in the data D1 (new data). The copy source bit address represents a bit address of the top bit in the copy bit string in the data D0 (old data). The copy bit string length represents a bit length of the copy bit string.

In step S9 in FIG. 16, the additional bit string extracting unit 4c (additional bit string data generating unit 4c1) excludes, based on the information on copy bit strings, copy bit strings from the data D1 to extract information on additional bit strings, and stores the infoiiiiation on additional bit strings into the internal memory. After that, the operation of the difference extracting unit 4 in FIG. 16 ends.

FIG. 19 is a view illustrating an exemplary configuration of information on additional bit strings.

The information on additional bit strings includes a number of additional bit string records, and additional bit string records corresponding to an amount indicated by the number of additional bit string records. Each of the additional bit string records includes fields for a record identifier, an addition destination bit address, an additional bit string length, and an additional bit string. At this point, the record identifier is a field for indicating that the record is an additional bit string record, and stores a value of 2. The addition destination bit address represents a bit address of a top bit in an additional bit string in the data D1 (new data). The additional bit string length represents a bit length of the additional bit string. The additional bit string represents the additional bit string itself.

As described above, the difference extracting unit 4 compares the data D0 with the data D1 shifted in a range from −7 to +7 bit(s) to obtain copy bit strings and additional bit strings. Therefore, even if a discrepancy occurs in terms of bit between the old data and the new data, copy bit strings can be increased, while additional bit strings can be decreased. As a result, the effect of reducing differential data in size can be enhanced.

Moreover, in the above description, a case in which a CPU is used to perform processes of steps S4 and S5 for each shift amount in order (sequentially) is described. However, as described above, by using a plurality of CPUs, processes of steps S4 and S5 for each shift amount may be performed in parallel.

Next, main processes in FIG. 16 will now be described in detail.

<Bit Shift Process (step S4)>

Figure 20:
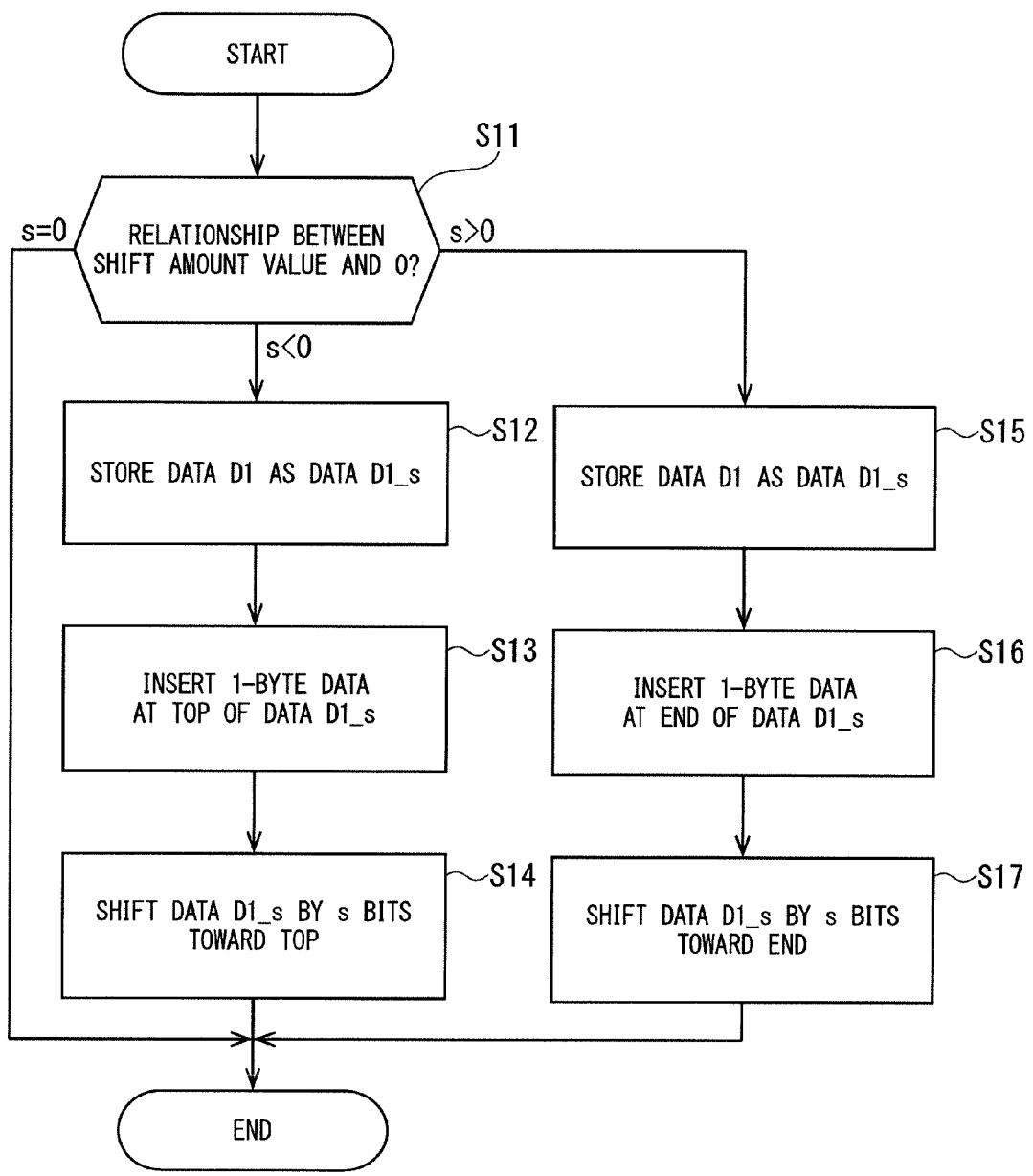
FIG. 20 is a flowchart illustrating an exemplary bit shift process according to the first embodiment.

FIG. 20 is a flowchart illustrating in detail an example of step S4 in FIG. 16, i.e. a bit shift process.

First, in step S11, the difference extracting unit 4 checks a value of a bit shift amount s. When s=0, the difference extracting unit 4 determines that no bit shift is required, and ends the bit shift process in FIG. 20. When s<0, the difference extracting unit 4 determines that a shift should be made in a backward direction of a bit string (direction toward a top of the bit string) by an absolute value of the bit shift amount s, and allows the process to proceed to step S12. When s>0, the difference extracting unit 4 determines that a shift should be made in a forward direction of the bit string (direction toward an end of the bit string) by the bit shift amount s, and allows the process to proceed to step S15.

In step S12, the bit shift unit 4a in FIG. 2 stores the data D1 without change, as data D1_s, into the internal memory.

In step S13, the bit shift unit 4a inserts, at a top of the data D1_s, 1-byte data (value is 0).

In step S14, the bit shift unit 4a shifts the data D1_s toward the top by the absolute value of the bit shift amount s. After that, the bit shift process in FIG. 20 ends.

When the process proceeds from step S11 to step S15, the bit shift unit 4a stores the data D1 without change, as the data D1_s, into the internal memory.

In step S16, the bit shift unit 4a inserts, at an end of the data D1_s, 1-byte data (value is 0).

In step S17, the bit shift unit 4a shifts the data D1_s toward the end by the bit shift amount s. After that, the bit shift process in FIG. 20 ends.

<Extraction Process for Information on Intermediate Copy Bit Strings (step S5)>

Figure 21:
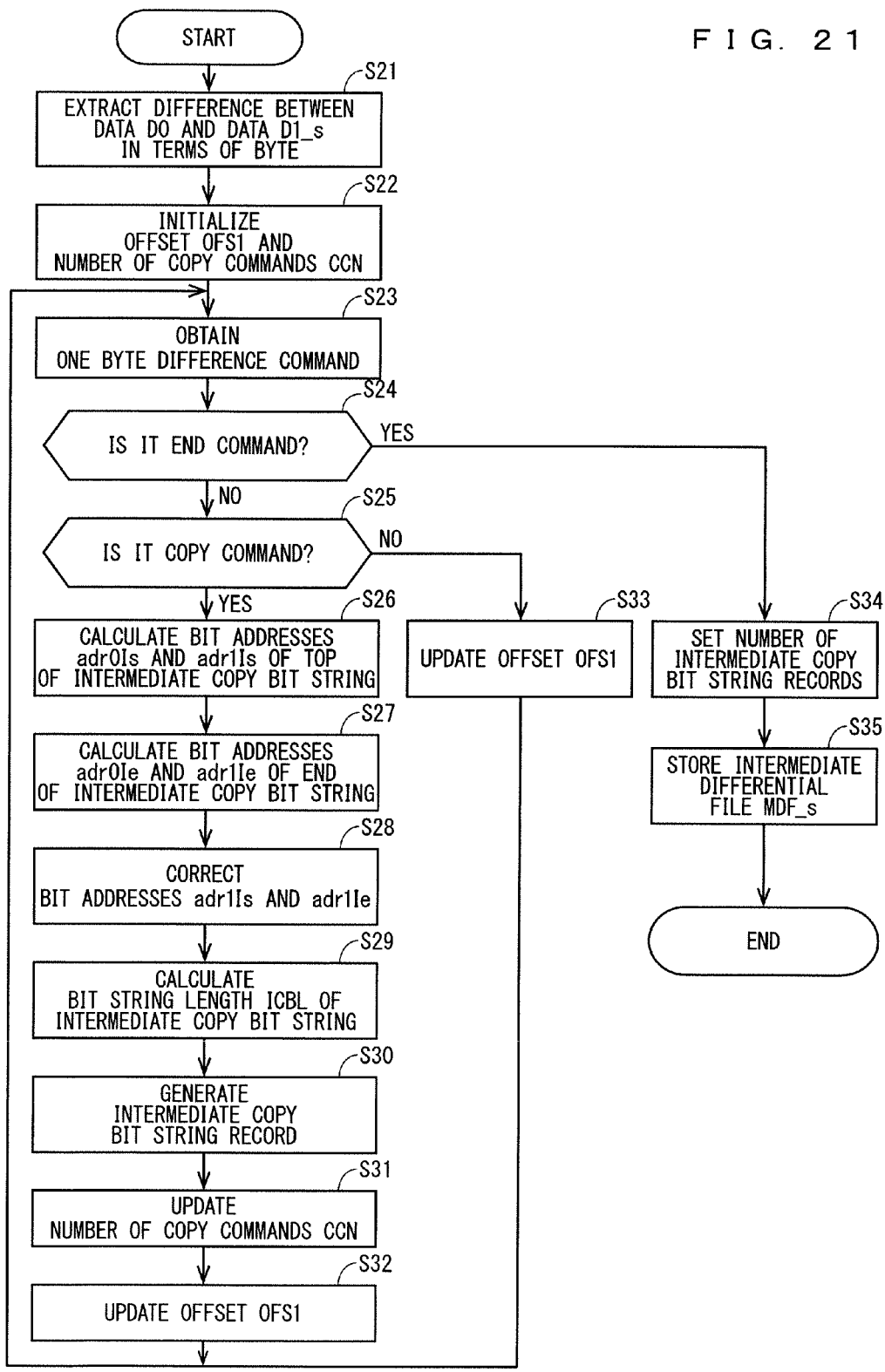
FIG. 21 is a flowchart illustrating an exemplary extraction process for information on intermediate copy bit strings, according to the first embodiment.

FIG. 21 is a flowchart illustrating in detail an example of step S5 in FIG. 16, i.e. extraction process (generation process) for information on intermediate copy bit strings.

First, in step S21, the copy bit string extracting unit 4b in FIG. 2 compares the data D0 (non-shifted old data) with the data D1_s (shifted new data) in terms of byte to extract a difference between the data. In here, based on the data D1_s and the non-shifted data D0, the copy bit string extracting unit 4b extracts a byte string from the data D1_s, that is also included in the data D0, as a copy byte string, and extracts a byte string from the data D1_s, that is not included in the data D0, as an additional byte string. The extracted difference is stored, as byte differential data, into the internal memory.

Figure 22:
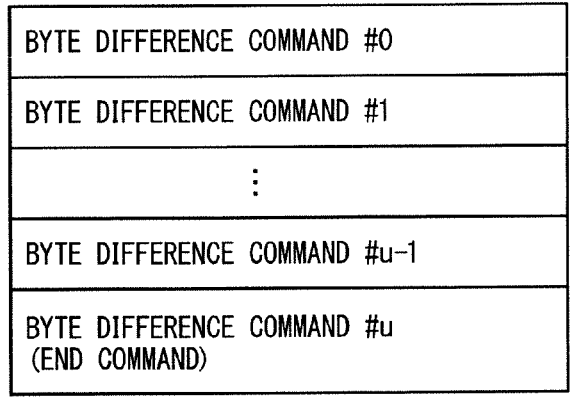
FIG. 22 is a view illustrating an exemplary configuration of byte differential data, according to the first embodiment.

FIG. 22 is a view illustrating an exemplary configuration of byte differential data.

The byte differential data includes a predetermined number of byte difference commands. The byte difference commands are each allocated with either an addition command regarding an additional byte string, a copy command regarding a copy byte string, or an end command.

Figure 23:
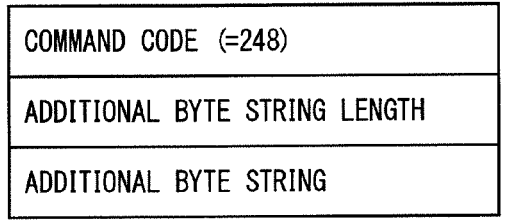
FIG. 23 is a view illustrating an exemplary configuration of an addition command according to the first embodiment.

FIG. 23 is a view illustrating an exemplary configuration of an addition command.

The addition command includes fields for a command code, an additional byte string length, and an additional byte string. The command code is 1-byte data indicating that the byte difference command is an addition command, and has a value of 248. The additional byte string length represents a number of bytes in an additional byte string with a 32-bit integer. The additional byte string represents the additional byte string itself.

Figure 24:
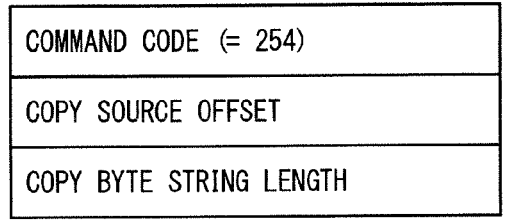
FIG. 24 is a view illustrating an exemplary configuration of a copy command according to the first embodiment.

FIG. 24 is a view illustrating an exemplary configuration of a copy command.

The copy command includes a command code, a copy source offset, and a copy byte string length. The command code is 1-byte data indicating that the byte difference command is a copy command, and has a value of 254. The copy source offset represents an offset for a top byte string in a copy byte string in the data D0 with a 32-bit integer. The copy byte string length represents a number of bytes in the copy byte string with a 32-bit integer.

Figure 25:
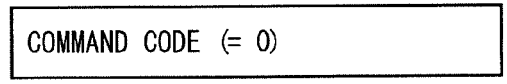
FIG. 25 is a view illustrating an exemplary configuration of an end command according to the first embodiment.

FIG. 25 is a view illustrating an exemplary configuration of an end command.

The end command is 1-byte data (value is 0). The end command is only provided at an end of byte differential data to indicate the end of the byte differential data.

In step S22 in FIG. 21, the copy bit string extracting unit 4b initializes both an offset OFS1 and a number of copy commands CCN provided in the internal memory to 0. Moreover, in an operation in FIG. 21, the offset OFS1 will indicate an offset for a top byte string of a copy byte string or an additional byte string in the data D1_s.

Each time step S23 is performed, the copy bit string extracting unit 4b obtains, from the byte differential data, a byte difference command (FIG. 22) one by one from a top in order. That is, when step S23 is perfoxined for a first time, from the byte differential data, a byte difference command (FIG. 22) at the top will be obtained, and when step S23 is performed for a second time and onward, a byte difference command next to the previously obtained byte difference command will be obtained.

In step S24, the copy bit string extracting unit 4b checks whether or not a value of a command code of the byte difference command obtained in step S23 is 0 to check whether or not the byte difference command is an end command. When the byte difference command is an end command, the copy bit string extracting unit 4b determines that a process for the byte difference command ends, and the copy bit string extracting unit 4b allows the process to proceed to step S34, otherwise allows the process to proceed to step S25.

In step S25, the copy bit string extracting unit 4b checks whether or not the value of the command code of the byte difference command obtained in step S23 is 254 to check whether or not the byte difference command is a copy command. When the byte difference command is a copy command, the copy bit string extracting unit 4b allows the process to proceed to step S26, otherwise the copy bit string extracting unit 4b determines that the byte difference command is an addition command, and allows the process to proceed to step S33.

When the process proceeds to step S26, i.e. when the byte difference command is a copy command, the copy bit string extracting unit 4b sets a copy source offset and a copy byte string length of the copy command respectively to OFS0 and CBYTL.

At this point, the above described copy command shows that a byte string from OFS0 (copy source offset) to an offset advanced by CBYTL (copy byte string length) in the data D0 is identical to a byte string from an offset OFS1 to an offset advanced by CBYTL (copy byte string length) in the data D1_s. These byte strings identical in the data D0 and in the data D1_s, i.e. bit strings forming a copy byte string correspond to the bit string MI shown in FIG. 14, thus, will be described herein as a bit string MI.

Within 1 byte immediately before or after the bit string MI, there is a possibility that a bit string in succession to the bit string MI and identical in the data D0 and in the data D1_s is included. A bit string included within 1 byte immediately before the bit string MI and identical in the data D0 and in the data D1_s corresponds to the bit string ST shown in FIG. 14, thus, will be described herein as a bit string ST. A bit string included within 1 byte immediately after the bit string MI and identical in the data D0 and in the data D1_s corresponds to the bit string EN shown in FIG. 14, thus, will be described herein as a bit string EN.

Since the bit string MI has been obtained in step S21, obtaining the bit string ST and the bit string EN can obtain an intermediate copy bit string.

Accordingly, in step S26, after setting OFS0 and CBYTL described above, the copy bit string extracting unit 4b obtains the bit string ST. For example, the copy bit string extracting unit 4b compares 1 byte whose offset is "OFS0-1" in the data D0 with 1 byte whose offset is "OFS1-1" in the data D1_s in a backward direction of a bit string (order from a bottom level bit toward a top level bit) until no conformity is observed so as to obtain a number of bits (XBN).

And then a bit address adr0Is (hereinafter simply referred to as "adr0Is") of a top of an intermediate copy bit string in the data D0 at a top and a bit address adr1Is (hereinafter simply referred to as "adr1Is") of a top of an intermediate copy bit string in the data D1s are obtained as described below.

adr0Is=OFS0*8−XBN add Is=OFS1*8−XBN

That is, in step S26, the copy bit string extracting unit 4b determines whether or not a bit included within 1 byte immediately before a byte string (bit string MI) extracted in terms of byte from the data D1_s conforms to a bit included within 1 byte immediately before a byte string (bit string MI) extracted in terms of byte from the data D0 in a backward direction of a bit string in order, to obtain adr1Is (first address) of the data D1_s and adr0Is (second address) of the data D0 when the bits are finally conformed each other.

In step S27, the copy bit string extracting unit 4b obtains a bit string EN. For example, the copy bit string extracting unit 4b compares 1 byte whose offset is "OFS0+CBYTL in the data D0 with 1 byte whose offset is "OFS1+CBYTL" in the data D1s in a forward direction of a bit string in order (order from a top level bit toward a bottom level bit) until no conformity is observed so as to obtain a number of bits (YBN).

And then a bit address adr0Ie (hereinafter simply referred to as "adr0Ie") of an end of an intermediate copy bit string in the data D0 and a bit address adr1Ie (hereinafter simply referred to as "adr1Ie") of an end of an intermediate copy bit string in the data D1_s are obtained as described below.

adr0Ie=(OFS0+CBYTL)*8+YBN−1
adr1Ie=(OFS1+CBYTL)*8+YBN−1

That is, in step S27, the copy bit string extracting unit 4b determines whether or not a bit included within 1 byte immediately after a byte string (bit string MI) extracted in terms of byte from the data D1_s conforms to a bit included within 1 byte immediately after a byte string (bit string MI) extracted in terms of byte from the data D0 in a forward direction of a bit string in order, to obtain adr1Ie (third address) of the data D1_s and adr0Ie (fourth address) of the data D0 when the bits are finally conformed each other.

At this point, adr1Is and adr1Ie obtained in steps S26 and S27 are bit addresses of the intermediate copy bit string in the data D1_s after shifted.

In light of the above, in step S28, the copy bit string extracting unit 4b corrects adr1Is and addle to addresses used before the bit shift unit 4a performs a shift. That is, the copy bit string extracting unit 4b shifts values of adr0Is and adrrIe in a direction opposite to a direction of a shift performed by the bit shift unit 4a (step S4).

In step S29, the copy bit string extracting unit 4b obtains a bit string length ICBL of the intermediate copy bit string as described below.

ICBL=adr0Ie−adr0Is+1

In step S30, the copy bit string extracting unit 4b sets corrected adr0Is, adr0Is, and ICBL respectively to an intermediate copy destination bit address, an intermediate copy source bit address, and an intermediate copy bit string length for an intermediate copy bit string record (FIG. 17). Therefore, the intermediate copy bit string record (FIG. 17) is generated.

With the above described steps S28 to S30, the copy bit string extracting unit 4b corrects adr1Ie and adr0Is, and, based on adr0Ie and adr0Is and corrected adr1Ie and adr1Is, generates information on intermediate copy bit strings.

In this regard, since a difference between adr0Ie and adr0Is and a difference between adr1Ie and adr0Is are even, after either adr1Ie or adr1Is is determined, another is determined. In light of the above, the copy bit string extracting unit 4b may correct adr1Ie or adr0Is, and, based on adr0Ie and adr0Is and corrected adr1Ie or adr0Is, generate information on intermediate copy bit strings.

In step S31, the copy bit string extracting unit 4b adds 1 to the number of copy commands CCN to update the number of copy commands CCN.

In step S32, the copy bit string extracting unit 4b adds a copy byte string length included in the copy command recently obtained in step S23 (FIG. 18) to the offset OFS1 to update the offset OFS1. Therefore, the offset OFS1 indicates an offset for a top byte string in an additional byte string in the data D1_as, indicated by a next addition command, or an offset for a top byte string in a copy byte string in the data D1_s, indicated by a next copy command. After that, the process returns to step S23.

When the process proceeds from step S25 to step S33, the copy bit string extracting unit 4b adds an additional byte string length included in the addition command recently obtained in step S23 (FIG. 19) to the offset OFS1 to update the offset OFS1. Therefore, the offset OFS1 indicates an offset for a top byte string in an additional byte string in the data D1_s, indicated by a next addition command, or an offset for a top byte string in a copy byte string in the data D1_s, indicated by a next copy command. After that, the process returns to step S23.

When the process proceeds from step S24 to step S34, the copy bit string extracting unit 4b sets the number of copy commands CCN as a number of intermediate copy bit string records.

In step S35, the copy bit string extracting unit 4b generates information on intermediate copy bit strings in FIG. 17, which includes the intermediate copy bit string record generated in step S30 and the number of intermediate copy bit string records set in step S34, and stores the information on intermediate copy bit strings, as an intermediate differential file MDF_s, into the intermediate data storing unit 5. After that, the extraction process (generation process) for intermediate copy bit strings in FIG. 21 ends.

At this point, using FIG. 14 as an example, the process in FIG. 21 will now be described herein. In FIG. 14, a bit shift amount s with which the data D1 should be shifted=−S(i)=−2.

In step S21, the copy bit string extracting unit 4b obtains byte differential data from the data D0 and the data D1_s (shifted from the data D1 by −2 bits). The byte differential data obtained in here is data regarding the bit string MI in FIG. 14, and includes a copy command having fields described below. Moreover, for notations of the copy command described below, ofsEs(i) and bylngCopyE(i) in FIG. 14 are used.

Copy source offset=ofsEs(i)+1
Copy byte string length=bylngCopyE(i)

In step S22, the copy bit string extracting unit 4b obtains the above described copy command. Through steps S23 to S25, and in step S26, the copy bit string extracting unit 4b sets a copy source offset (ofsEs(i)+1 in the data D0) to OFS0, and sets a copy byte string length (bylngCopyE(i)) to CBYTL. Moreover, OFS1 represents an offset for a top byte string in an additional byte string or a copy byte string in the data D1_s, and, in here, corresponds to ofsAs(i)+1 in the data D1_s in FIG. 14.

In step S26, the copy bit string extracting unit 4b compares 1 byte whose offset is OFS0-1=ofsEs(i) in the data D0 with 1 byte whose offset is OFS1-1=ofsAs(i) in the data D1_s from a bottom level bit in order. Therefore, a bit string ST is obtained, and XBN=6 is obtained. As a result, adr0Is (=bitnEs(i)) at a top of an intermediate copy bit string in the data D0 and adr1Is (=bitnAs_s(i)) at a top of an intermediate copy bit string in the data D1_s are obtained.

In step S27, the copy bit string extracting unit 4b compares 1 byte whose offset is OFS0+CBYTL=ofsEe(i) in the data D0 with 1 byte whose offset is OFS1+CBYTL=ofsAe(i) in the data D1_s from a top level bit in order. Therefore, a bit string EN is obtained, and YBN=4 is obtained. As a result, adr0Ie (=bitnEe(i)) at an end of the intermediate copy bit string in the data D0 and addle (=bitnAe_s(i)) at an end of the intermediate copy bit string in the data D1_s are obtained.

In step S28, the copy bit string extracting unit 4b shifts adr1Is (=bitnAs_s(i)) and adr1Ie (=bitnAe_s(i)) in the data D1_s in a direction opposite to a direction of a shift (step S4) performed by the bit shift unit 4a. Therefore, bitnAs(i) and bitnAe(i) in the data D1 are obtained.

Through the operation described above, with each bit shift amount s (s=−7 to 7), by making a bit shift correction for a bit string common to the data D0 and the data D1_s, the intermediate copy bit string is obtained. As a result, as shown in FIG. 15, a plurality of intermediate differential files MDF_s (FIG. 17) are obtained.

<Extraction Process for Information on Copy Bit Strings (step S8)>

Figure 26:
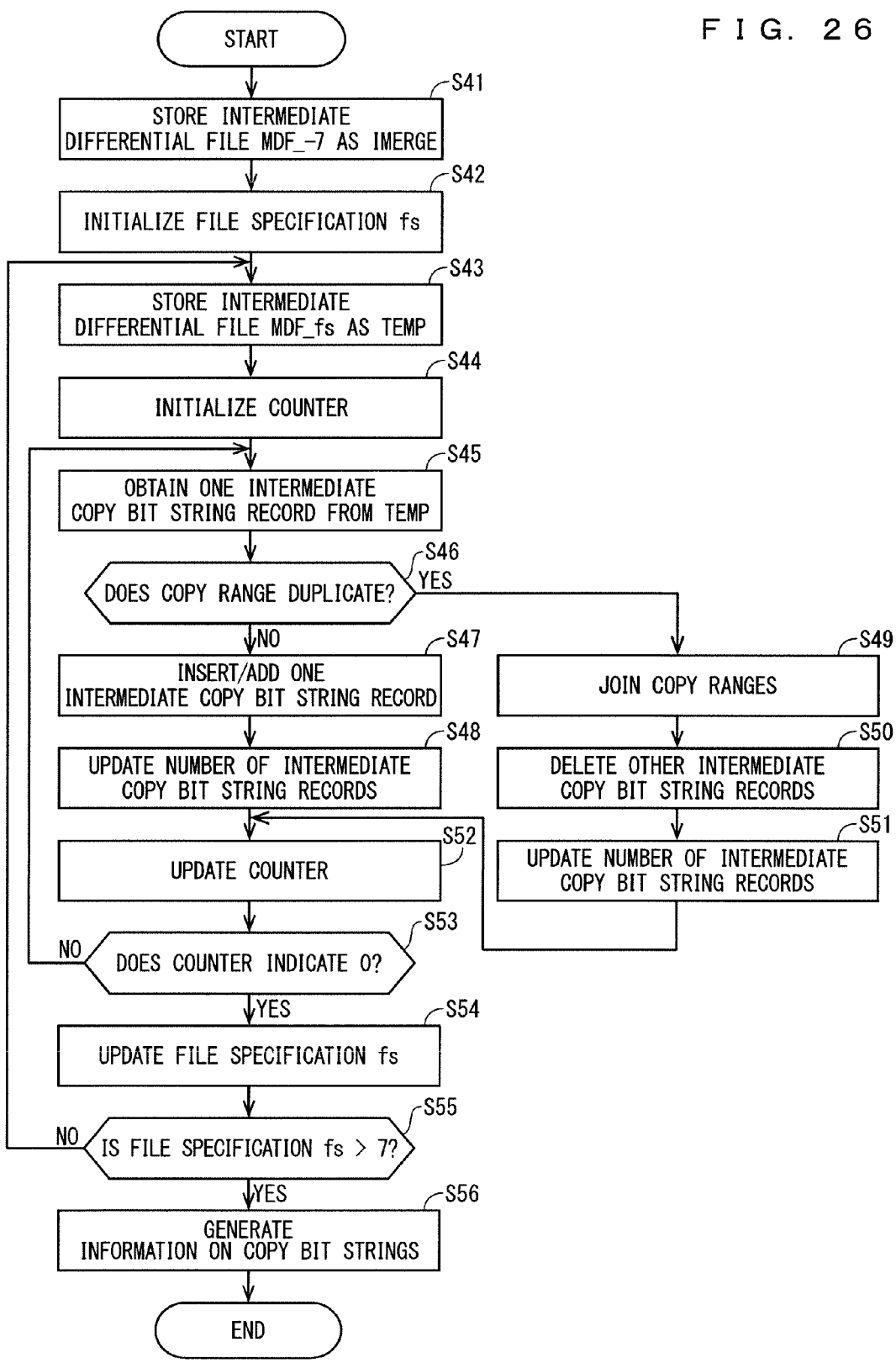
FIG. 26 is a flowchart illustrating an exemplary extraction process for information on copy bit strings, according to the first embodiment.

FIG. 26 is a flowchart illustrating in detail an example of step S8 in FIG. 16, i.e. extraction process (generation process) for information on copy bit strings.

First, in step S41, the copy bit string extracting unit 4b reads the intermediate differential file MDF_−7, and stores the intermediate differential file MDF_−7, as merge information on intermediate bit strings IMERGE, into the internal memory. Therefore, the information on intermediate copy bit strings shown in FIG. 17 is stored, as the merge information on intermediate bit strings IMERGE, into the internal memory.

In step S42, the copy bit string extracting unit 4b sets a file specification fs (fs=−6 to 7) to −6 to initialize the file specification fs. Moreover, the file specification fs specifies an intermediate differential file MDF_fs that should be read separately from step S41.

In step S43, the copy bit string extracting unit 4b reads the intermediate differential file MDF_fs specified in the file specification fs, and stores the intermediate differential file MDF_fs, as temporary information on intermediate copy bit strings TEMP, into the internal memory. Therefore, the information on intermediate copy bit strings shown in FIG. 17 is stored, as the temporary information on intermediate copy bit strings TEMP, into the internal memory.

In step S44, the copy bit string extracting unit 4b sets a number of intermediate copy bit string records in the temporary information on intermediate copy bit strings TEMP into a counter provided in the internal memory to initialize the counter.

Each time step S45 is performed, the copy bit string extracting unit 4b obtains an intermediate copy bit string record from the temporary information on intermediate copy bit strings TEMP from a top in order. That is, when step S45 is performed for a first time, the intermediate copy bit string record at the top will be obtained, and when step S45 is performed for a second time and onward, an intermediate copy bit string record next to the previously obtained intermediate copy bit string record will be obtained.

In step S46, the copy bit string extracting unit 4b obtains a copy range in an intermediate copy bit string for each intermediate copy bit string record in the merge information on intermediate bit strings IMERGE and an intermediate copy bit string record in the temporary information on intermediate copy bit strings TEMP. At this point, a copy range in an intermediate copy bit string is a range of bit addresses in an intermediate copy bit string in the data D0, and the copy range is specified based on an intermediate copy source bit address and an intermediate copy bit string length of an intermediate copy bit string record (FIG. 17). In here, a copy range is a range of bit addresses in the data D0, from an "intermediate copy source bit address" to an "intermediate copy source bit address+an intermediate copy bit string length −1."

And then the copy bit string extracting unit 4b determines whether or not a copy range in each intermediate copy bit string record in the merge information on intermediate bit strings IMERGE even partially duplicates with a copy range in an intermediate copy bit string record in the temporary information on intermediate copy bit strings TEMP. If the copy range duplicates, the process proceeds to step S49, and if the copy range does not duplicate, the process proceeds to step S47.

In step S47, the copy bit string extracting unit 4b inserts the intermediate copy bit string record obtained in step S45 into the merge information on intermediate bit strings IMERGE, or adds the intermediate copy bit string record to an end of the merge information on intermediate bit strings IMERGE. In this regard, the above described insertion and addition should be performed so that an intermediate copy bit string record in the temporary information on intermediate copy bit strings TEMP and each intermediate copy bit string record in the merge information on intermediate bit strings IMERGE are arranged in an ascending order of intermediate copy source bit addresses.

In step S48, the copy bit string extracting unit 4b adds 1 to the number of intermediate copy bit string records in the merge information on intermediate bit strings IMERGE to update the number of intermediate copy bit string records. After that, the process proceeds to step S52.

When the process proceeds from step S46 to step S49, the copy bit string extracting unit 4b joins, with regard to duplicated copy ranges, the intermediate copy bit string records in the merge information on intermediate bit strings IMERGE and the intermediate copy bit string records in the temporary information on intermediate copy bit strings TEMP.

Therefore, a joined copy range in which copy ranges in the intermediate copy bit string records are joined is obtained, and a joined bit string including the joined copy range is obtained. A joined copy range should be a minimum range including all duplicated copy ranges. A minimum bit address of a joined copy range is referred to as adrCAmin, and a maximum bit address of the joined copy range is referred to as adrCAmax, and will now specifically be described herein.

Figure 27:
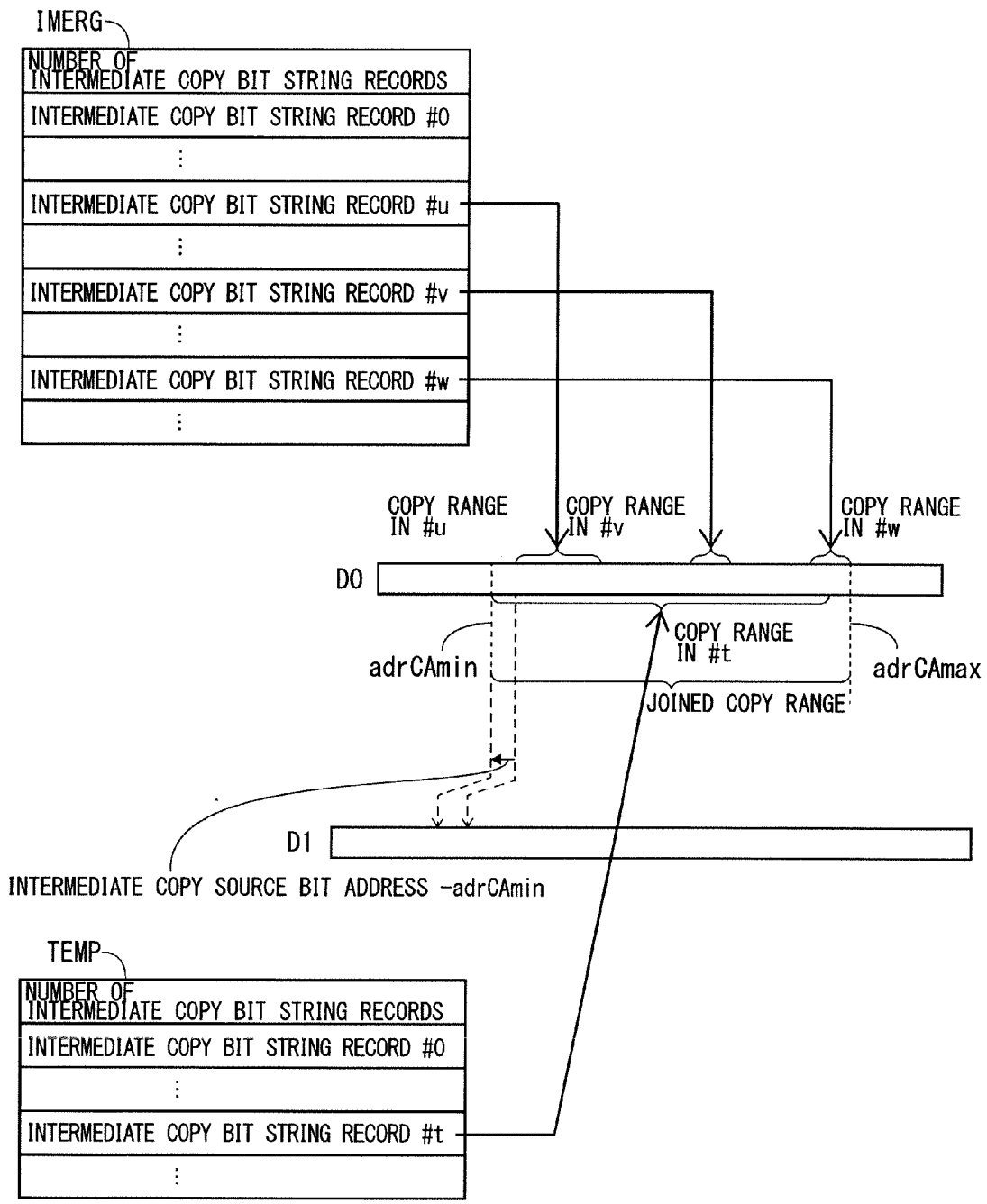
FIG. 27 is a view illustrating an exemplary joined copy range according to the first embodiment.

FIG. 27 is a view illustrating an exemplary joined copy range.

In the example in FIG. 27, a copy range in an intermediate copy bit string record #t in the temporary information on intermediate copy bit strings TEMP duplicates with copy ranges in intermediate copy bit string records #u, #v, and #w in the merge information on intermediate bit strings IMERGE. Therefore, a minimum range including all of these copy ranges is a joined copy range.

In step S50 in FIG. 26, the copy bit string extracting unit 4b deletes records, except only an intermediate copy bit string record at a top, from join-target intermediate copy bit string records in the merge information on intermediate bit strings IMERGE. An intermediate copy destination bit address, an intermediate copy source bit address, and an intermediate copy bit string length of the remained intermediate copy bit string record at the top (FIG. 17) are changed and set as described below.

(1) Subtract an "intermediate copy source bit address −adrCAmin" from the remained intermediate copy destination bit address (bit address in the data D1) at the top. In this regard, the intermediate copy source bit address should be a value used before making a setting as described below in (2). Therefore, the intermediate copy destination bit address changes by the joined copy range. (2) Set adrCAmin in a remained intermediate copy source bit address (bit address in the data D0) at the top. (3) Set "adrCAmax−adrCAmin+ 1" in a remained intermediate copy source bit string length at the top.

In the example in FIG. 27, from the intermediate copy bit string records #u, #v, and #w in the merge information on intermediate bit strings IMERGE, the intermediate copy bit string record #u at the top remains, while the other intermediate copy bit string records #v and #w are deleted. Each field for the remained intermediate copy bit string record #u at the top is changed as described above.

In step S51, the copy bit string extracting unit 4b performs a subtraction by a number whose intermediate copy bit string records are deleted from the merge information on intermediate bit strings IMERGE in step S50 to reduce the number of intermediate copy bit string records in the merge information on intermediate bit strings IMERGE to update the number of intermediate copy bit string records. After that, the process proceeds to step S52.

In step S52, the copy bit string extracting unit 4b subtracts only 1 from the counter to update the counter.

In step S53, the copy bit string extracting unit 4b determines whether or not the counter is 0. When the copy bit string extracting unit 4b determines that the counter is 0, the copy bit string extracting unit 4b determines that a process for all intermediate copy bit string records in the temporary information on intermediate copy bit strings TEMP ends, and allows the process to proceed to step S54. If not, the process returns to step S45.

In step S54, the copy bit string extracting unit 4b adds 1 to the file specification fs to update the file specification fs.

In step S55, the copy bit string extracting unit 4b determines whether or not the file specification fs is greater than 7. When the copy bit string extracting unit 4b determines that the file specification fs is greater than 7, the copy bit string extracting unit 4b determines that a process for the intermediate differential file MDF_fs (fs=−6 to 7) ends, and allows the process to proceed to step S56. If not, the process returns to step S43.

In step S56, the copy bit string extracting unit 4b sets a number of intermediate copy bit string records in the merge information on intermediate bit strings IMERGE to a number of copy bit string records in the information on copy bit strings (FIG. 18). In addition, the copy bit string extracting unit 4b sets a number obtained by adding a record identifier (=1) to the intermediate copy bit string record in the merge information on intermediate bit strings IMERGE as a copy bit string record in the information on copy bit strings (FIG. 18). Therefore, the information on copy bit strings (FIG. 18) is generated. After that, the extraction process (generation process) for copy bit strings in FIG. 26 ends.

As described above, from a copy range in each intermediate copy bit string in the intermediate differential files MDF_−7 to MDF_7, information on bit strings including at least either of an intermediate copy bit string in which no copy range duplicates with others and a joined bit string having a joined copy range in which duplicated copy ranges are joined is obtained as final information on copy bit strings.

Therefore, a copy range in a final copy bit string is increased as large as possible. Therefore, a plurality of copy bit string records can be integrated into a copy bit string record, thus a data size required for copy bit string records, consequently, a size of differential data, can be reduced.

<Extraction Process for Information on Additional Bit Strings (step S9)>

Figure 28:
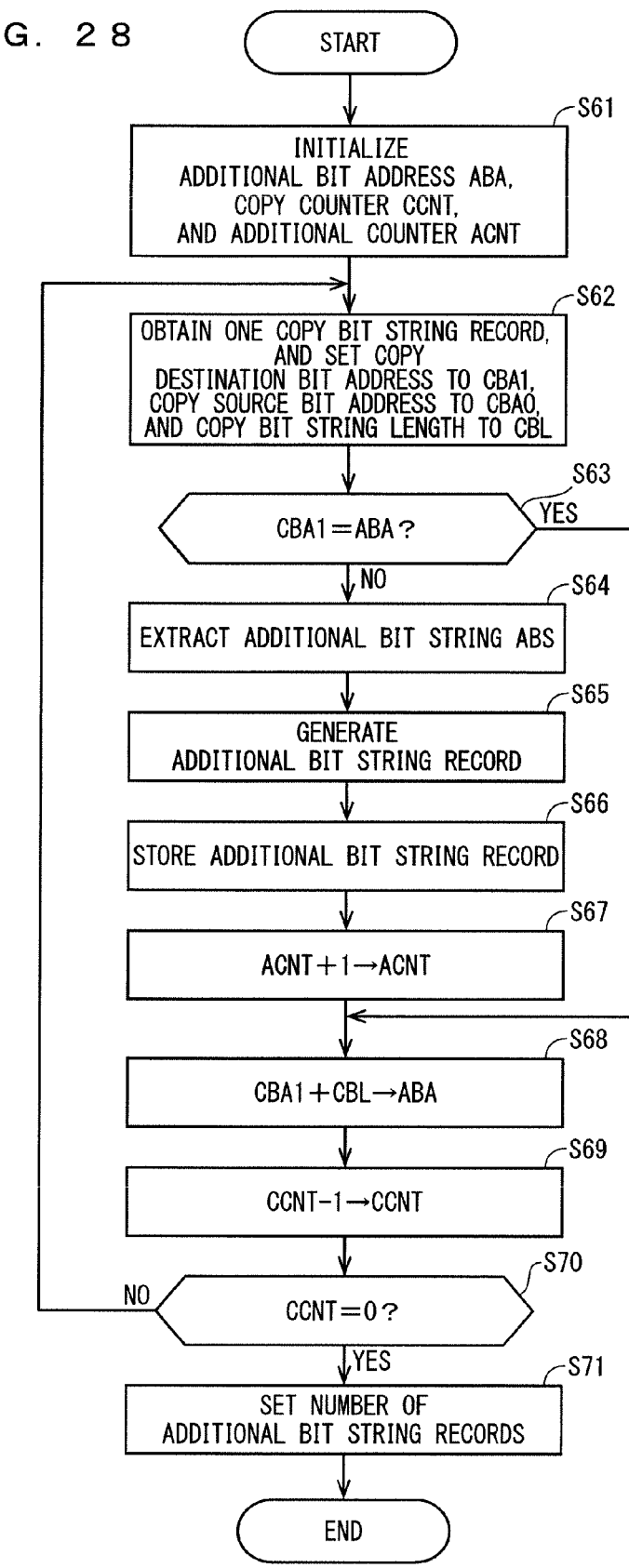
FIG. 28 is a flowchart illustrating an exemplary extraction process for information on additional bit strings, according to the first embodiment.

FIG. 28 is a flowchart illustrating in detail an example of step S9 in FIG. 16, i.e. extraction process (generation process) for information on additional bit strings. FIG. 29 is a view illustrating an exemplary extraction process (generation process) for information on additional bit strings.

First, in step S61 in FIG. 28, the additional bit string extracting unit 4c initializes an additional bit address ABA (hereinafter simply referred to as "ABA"), a copy counter CCNT (hereinafter simply referred to as "CCNT"), and an additional counter ACNT (hereinafter simply referred to as "ACNT") provided in the internal memory. In here, as an initialization, 0 is set in ABA, a number of copy bit string records in the information on copy hit strings (FIG. 18) is set in CCNT, and 0 is set in ACNT. Moreover, in the operation in FIG. 28, ABA roughly indicates a bit address of a top of an additional bit string in the data D1.

Each time a step S62 is performed, the additional bit string extracting unit 4c obtains a copy bit string record from the information on copy bit strings (FIG. 18) from a top in order. That is, when step S62 is perfoiined for a first time, a copy bit string record at the top will be obtained, and when step S62 is performed for a second time and onward, a copy bit string record next to the previously obtained copy bit string record is obtained.

For the copy bit string record obtained in step S62, a copy destination bit address is set to CBA1, a copy source bit address is set to CBA0, and a copy bit string length is set to CBL.

In the example in FIG. 29, when step S62 is performed for a first time, cbal_0, i.e. copy destination bit address, is set to CBA1, cba0_0, i.e. copy source bit address, is set to CBA0, and cb1_0, i.e. copy bit string length, is set to CBL.

In step S63, the additional bit string extracting unit 4c compares the copy bit string record CBA1 obtained in step S62 with ABA. When CBA1 conforms to ABA, the process proceeds to step S68, if not, the process proceeds to step S64.

At this point, a case when CBA1 conforms to ABA indicates that, in the data D1, a copy bit string is present from a bit indicated by ABA (=CBA1) to the copy bit string length CBL in the above described copy bit string record. A case when CBA1 does not conform to ABA indicates that, in the data D1, an additional bit string is present from a bit indicated by ABA (<CBA1) to a bit indicated by "CBA1-1."

For example, when an additional bit string is present at a top of the data D1 as shown in FIG. 29, in the first step S63, CBA1 (=cbal_0≠0) does not conform to ABA (=0) with regard to a copy bit string record #0. In this case, an additional bit string is present from ABA (=0) to "CBA-1 (=cbal_0-1)" in the data D1.

On the other hand, when a copy bit string is present (not shown) at the top of the data D1, in the first step S63, CBA1 (=cbal_0=0) conforms to ABA (=0) with regard to the copy bit string record #0. In this case, a copy bit string is present from ABA (=0) to "CBA-1 (=cbal_0-1)" in the data D1.

When the process proceeds from step S63 to step S64 in FIG. 28, i.e. in a case shown in FIG. 29, the additional bit string extracting unit 4c obtains, as an additional bit string ABS, a bit string from the bit address ABA to "CBA-1" in the data D1.

For example, in a state of FIG. 29, when step S64 is performed for a first time, an additional bit string A0 in the data D1 is obtained as the additional bit string ABS.

In step S65 in FIG. 28, the additional bit string extracting unit 4c sets ABA, "CBA1-1," and the additional bit string ABS respectively in an addition destination bit address, an additional bit string length, and an additional bit string of an additional bit string record (FIG. 19) to obtain data, and adds a record identifier (=2) to the data. Therefore, the additional bit string record (FIG. 19) is generated.

For example, in the state of FIG. 29, when step S65 is performed for a first time, an additional bit string record #0 is generated for the additional bit string A0.

In step S66, the additional bit string extracting unit 4c stores the additional bit string record generated in step S65 after an additional bit string record stored previously. In this regard, a first additional bit string record is stored immediately after a range in which a number of additional bit string records is stored.

For example, in the state of FIG. 29, when step S66 is performed for a first time, a first additional bit string record #0 is stored immediately after the number of additional bit string records.

In step S67 in FIG. 28, the additional bit string extracting unit 4c adds 1 to ACNT, and counts a number of additional bit string records stored previously.

In step S68, the additional bit string extracting unit 4c sets, to ABA, a value obtained by adding the copy bit string record CBL to a copy bit string record CBA1 obtained in step S62. As a result, ABA indicates a bit address of a top of a next additional bit string.

For example, in the state of FIG. 29, when step S68 is performed for a first time, based on the copy bit string record #0 obtained in step S62, "cbal_0+cb1_0" is set as a second ABA. At this point, "cbal_0+cb1_0" indicates a bit address of a top of an additional bit string A1.

In step S69 in FIG. 28, the additional bit string extracting unit 4c subtracts 1 from CCNT to update CCNT.

In step S70, the additional bit string extracting unit 4c determines whether or not CCNT is 0. When the additional bit string extracting unit 4c determines that CCNT is 0, the additional bit string extracting unit 4c determines that a process for all copy bit string records ends, and allows the process to proceed to step S71. If not, the process returns to step S62.

In the example in FIG. 29, when step S63 is performed for a second time, with regard to a copy bit string record #1, CBA1 (=cbal_1) does not conform to ABA (=cbal_0+cb1_0). In this case, the process proceeds to step S64, and the additional bit string extracting unit 4c obtains, as an additional bit string A1, a bit string from ABA (=cbal_0+cb1_0) to "CBA1-1 (=cbal_1-1)" in the data D1.

After that, in step S65, an additional bit string record #1 is generated for the additional bit string A1. In step S66, the additional bit string record #1 is stored after the additional bit string record #0. Through step S67, and in step S68, based on copy bit string record #1 obtained in step S62, "cbal_1+cb1_1" is set as a third ABA. At this point, "cbal_1+cb1_1" represents a bit address of a top of an additional bit string A2.

Now, when the process proceeds from step S70 to step S71 in FIG. 28, the additional bit string extracting unit 4c sets ACNT as a number of additional bit string records in the information on additional bit strings (FIG. 19). Therefore, the infoiniation on additional bit strings (FIG. 19) is generated. After that, the extraction process (generation process) for information on additional bit strings in FIG. 28 ends.

<Operation of Differential Data Generating Unit>

The operation of the difference extracting unit 4 shown in FIG. 2 and FIG. 15 has been described. Next, an operation of the differential data generating unit 6 (difference command generating unit 6a) shown in FIG. 2 and FIG. 15 will now be described herein. Moreover, before describing the operation of the differential data generating unit 6, differential data to be generated through the operation of the differential data generating unit 6 will now be described herein.

Figure 30:
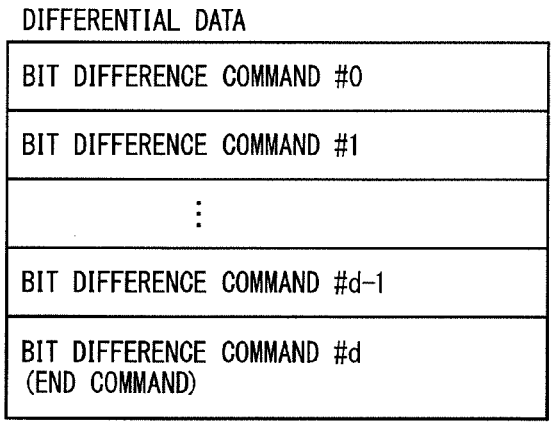
FIG. 30 is a view illustrating an exemplary configuration of differential data, according to the first embodiment.

FIG. 30 is a view illustrating an exemplary configuration of differential data to be generated by the differential data generating unit 6.

The differential data includes a predetermined number of bit difference commands. The bit difference commands are each allocated with either an additional bit command regarding an additional bit string, a copy bit command regarding a copy bit string, or an end command. An exemplary configuration of a bit difference command will now be described herein, but a configuration of a bit difference command is not limited to the configuration described below.

Figure 31:
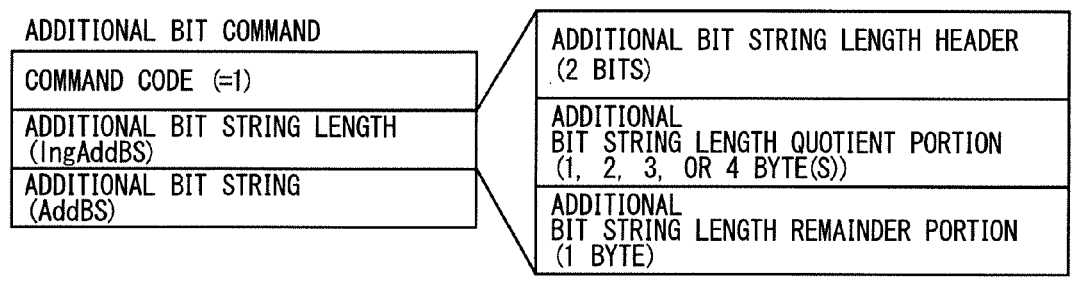
FIG. 31 is a view illustrating an exemplary configuration of an additional bit command according to the first embodiment.

FIG. 31 is a view illustrating an exemplary configuration of an additional bit command.

The additional bit command includes fields for a command code, an additional bit string length, and an additional bit string.

The command code is data having a length of 2 bits, indicates that a bit difference command is an additional bit command, and has a value of 1.

The additional bit string length represents a bit length (number of bits) of the additional bit string. In here, the additional bit string length includes an additional bit string length header, an additional bit string length quotient portion, and an additional bit string length remainder portion.

The additional bit string length header represents, in 2 bits, a number of bytes available for the additional bit string length quotient portion. For example, 0, 1, 2, and 3 respectively indicate that numbers of bytes available for the additional bit string length quotient portions are 1, 2, 3, and 4 byte(s).

The additional bit string quotient portion represents a quotient when the additional bit string length is divided by 256. The number of bytes available for the additional bit string quotient portion is determined by the additional bit string length header.

The additional bit string length remainder portion represents, in 1 byte, a remainder when the additional bit string length is divided by 256.

The additional bit string represents the additional bit string itself in the data D1.

Figure 32:
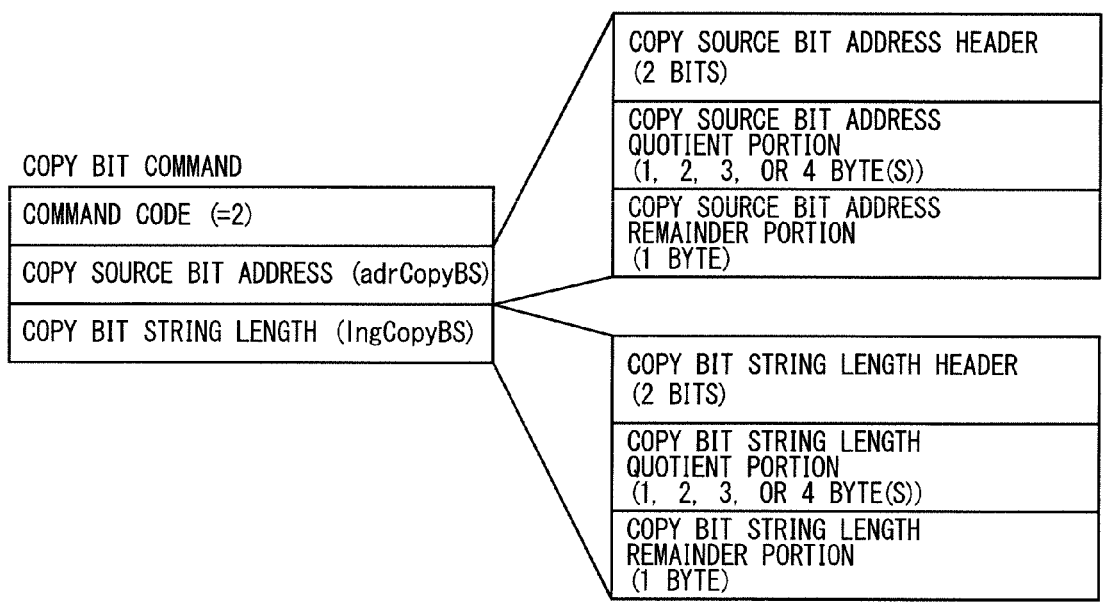
FIG. 32 is a view illustrating an exemplary configuration of a copy bit command according to the first embodiment.

FIG. 32 is a view illustrating an exemplary configuration of a copy bit command.

The copy bit command includes fields for a command code, a copy source bit address, and a copy bit string length.

The command code is data having a length of 2 bits, indicates that the bit difference command is a copy bit command, and has a value of 2.

The copy source bit address represents, for a copy bit string that should be copied from the data D0 to the data D1, a bit address of a top of the copy bit string in the data D0. In here, the copy source bit address includes a copy source bit address header, a copy source bit address quotient portion, and a copy source bit address remainder portion.

The copy source bit address header represents, in 2 bits, a number of bytes available for the copy source bit address quotient portion. For example, 0, 1, 2, and 3 respectively indicate that numbers of bytes available for the copy source bit address quotient portions are 1, 2, 3, and 4 byte(s).

The copy source bit address quotient portion represents a quotient when the copy source bit address is divided by 256.

A number of bytes available for the copy source bit address quotient portion is determined by the copy source bit address header.

The copy source bit address remainder portion represents, in 1 byte, a remainder when the copy source bit address is divided by 256.

The copy bit string length represents a bit length (number of bits) of the copy bit string that should be copied from the data D0 to the data D1. In here, the copy bit string length includes a copy bit string length header, a copy bit string length quotient portion, and a copy bit string length remainder portion.

The copy bit string length header represents, in 2 bits, a number of bytes available for the copy bit string length quotient portion. For example, 0, 1, 2, and 3 respectively indicate that numbers of bytes available for the copy bit string length quotient portions are 1, 2, 3, and 4 byte(s).

The copy bit string length quotient portion represents a quotient when the copy bit string length is divided by 256. A number of bytes available for the copy bit string length quotient portion is determined by the copy bit string length header.

The copy bit string length remainder portion represents, in 1 byte, a remainder when the copy bit string length is divided by 256.

Figure 33:
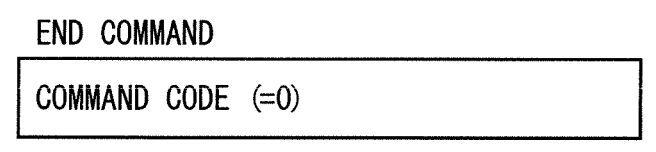

FIG. 33 is a view illustrating an exemplary configuration of an end command.

An end command includes only a command code. The command code is a field having a length of 2 bits and has a value of 0. The end command is provided only at an end of differential data to indicate the end of the differential data.

Figure 34:
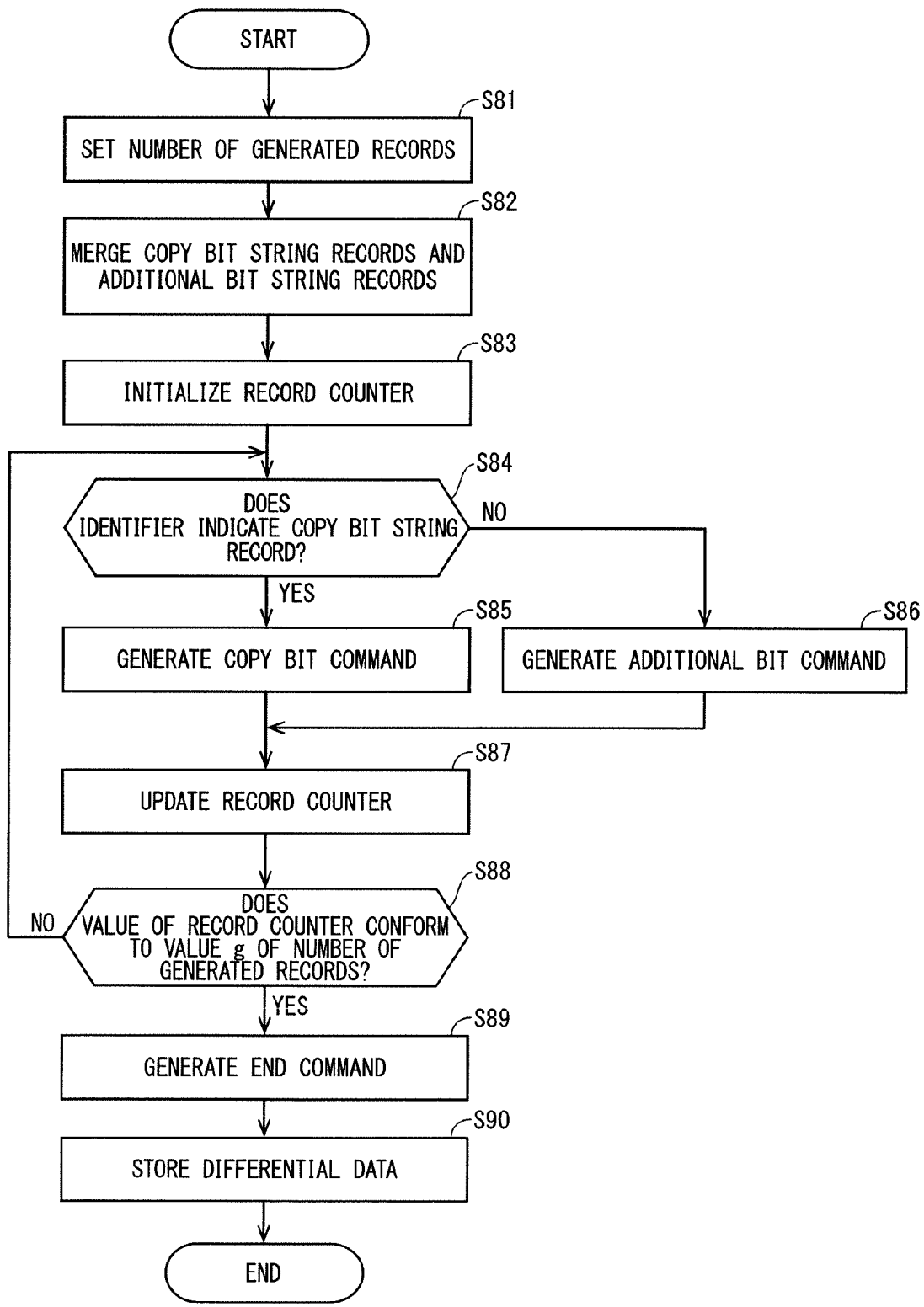
FIG. 34 is a flowchart illustrating an exemplary operation of the differential data generating unit according to the first embodiment.

FIG. 34 is a flowchart illustrating an exemplary operation of the differential data generating unit 6 (difference command generating unit 6a). Moreover, it is assumed that, as a prerequisite, the information on copy bit strings (FIG. 18) and the information on additional bit strings (FIG. 19) are already stored in the internal memory.

First, in step S81, the differential data generating unit 6 sets a value g obtained by adding a number of copy bit string records in the information on copy bit strings (FIG. 18) and a number of additional bit string records in the information on additional bit strings (FIG. 19), as a number of generated records provided in the internal memory.

In step S82, the differential data generating unit 6 merges the copy bit string records in the information on copy bit strings (FIG. 18) and the additional bit string records in the information on additional bit strings (FIG. 19), and stores information obtained through the merger, as merge information, into the internal memory. Moreover, in the merge information, the copy bit string records and the additional bit string records are merged in an ascending order of each of second fields (copy destination bit addresses and addition destination bit addresses) in the records.

FIG. 35 is a view illustrating an exemplary configuration of merge information.

In the merge information, the copy bit string records and the additional bit string records are stored in an ascending order of their second fields. A total of the copy bit string records and the additional bit string records to be stored is identical to the value g of the number of generated records. Moreover, in FIG. 35, SECF(i) (i=0, 1, . . . , g-1) represents a value in each of the second fields of the records.

In step S83 in FIG. 34, the differential data generating unit 6 sets a record counter provided in the internal memory to 0 for initialization.

Each time step S84 is performed, the differential data generating unit 6 obtains, from the merge information, records of either a copy bit string record or an additional bit string record one by one from a top in order. That is, when step S84 is performed for a first time, from the merge information, a record #0 at the top will be obtained, and when step S84 is performed for a second time and onward, a record #1 next to the previously obtained record #0 will be obtained.

And then the differential data generating unit 6 determines whether or not a record identifier of an obtained record is an identifier (=1) representing a copy bit string record. When the identifier is 1, the differential data generating unit 6 determines that the obtained record is a copy bit string record, and allows a process to proceed to step S85. If not, the differential data generating unit 6 determines that the obtained record is an additional bit string record, and allows the process to proceed to step S86.

In step S85, the differential data generating unit 6 generates, based on the copy bit string record obtained in step S84, a copy bit command (FIG. 32) set as described below, and adds the copy bit command to an end of differential data being generated. After that, the process proceeds to step S87.

Command code:
Sets 2 representing a copy bit command.
Copy source bit address:
Sets a copy source bit address for the copy bit string record.
Copy bit string length:
Sets a copy bit string length for the copy bit string record.

In step S86, the differential data generating unit 6 generates, based on the additional bit string record obtained in the step S84, an additional bit command (FIG. 31) set as described below, and adds the additional bit command to the end of the differential data being generated. After that, the process proceeds to step S87.

Command code:
Sets 1 representing an additional bit command.
Additional bit string length:
Sets an additional bit string length for the additional bit string record.
Additional bit string:
Sets an additional bit string for the additional bit string record.

In step S87, the differential data generating unit 6 adds 1 to a record counter value to update the record counter.

In step S88, the differential data generating unit 6 determines whether or not the record counter value conforms to the value g representing the number of generated records. When the differential data generating unit 6 determines conformity, the differential data generating unit 6 determines that generation of a bit difference command ends, and allows the process to proceed to step S89. When the differential data generating unit 6 determines nonconfoimity, the process returns to step S84.

In step S89, the differential data generating unit 6 generates an end command (FIG. 33), and adds the end command to an end of differential data being generated. Therefore, the differential data in FIG. 30 is generated.

In step S90, the differential data generating unit 6 stores the generated differential data into the differential data storing unit 7 (FIG. 2). After that, the operation of the differential data generating unit 6 in FIG. 34 ends.

The differential data generated as described above includes copy bit commands (information indicating addresses and lengths of copy bit strings included in the data D0) and additional bit commands (information indicating additional bit strings and lengths of the additional bit strings included in the data D1). And then, in the differential data, the copy bit commands and the additional bit commands are arranged in an order of addresses, in the data D1, of the copy bit strings and the additional bit strings included in the data D1. Therefore, the differential data can be reduced in size as much as possible.

<Operation of Data Updating Unit>

The operations of main components of the differential data creating device 1 in FIG. 2 have been described above. Next, an operation of the data updating unit 15 in the data updating device 11 in FIG. 3 will now be described herein. Moreover, an operation of the data updating unit 25 in the information processing device 21 in FIG. 4 is similar or identical to the operation of the data updating unit 15 described below.

FIG. 36 is flowchart illustrating an exemplary data updating operation of the data updating unit 15. As can be apparent from the below description, this updating operation generates data D2 identical to new data (data D1).

First, in step S101 in FIG. 36, the data updating unit 15 reads, from the data storing unit 14 (FIG. 3), lngBS0 and the data D0 in the file F0 (FIGS. 12A and 12B), i.e. old data, and stores lngBS0 and the data D0 into the internal memory.

In step S102, the data updating unit 15 reads differential data from the differential data storing unit 13 (FIG. 3), and stores the differential data into the internal memory.

In step S103, the data updating unit 15 sets a storage bit address SBA provided in the internal memory to 0 for initialization. At this point, in the operation in FIG. 36, the storage bit address SBA represents a bit address of a top of an additional bit string or a copy bit string in the data D2.

Each time step S104 is performed, the data updating unit 15 obtains, from the differential data stored in the internal memory, a bit difference command from a top one by one in order. That is, when step S104 is performed for a first time, a bit difference command at the top in the differential data will be obtained, and when step S104 is performed for a second time and onward, a bit difference command next to the previously obtained bit difference command will be obtained.

In step S105, the data updating unit 15 determines whether or not a command code of the bit difference command obtained in step S104 is a command code (=1) representing an additional bit command. When the command code is 1, the data updating unit 15 determines that the obtained bit difference command is an additional bit command, and allows a process to proceed to step S108. If not, the process proceeds to step S106.

In step S106, the data updating unit 15 determines whether or not the command code of the bit difference command obtained in step S104 is a command code (=2) representing a copy bit command. When the command code is 2, the data updating unit 15 determines that the obtained bit difference command is a copy bit command, and allows the process to proceed to step S110. If not, the process proceeds to step S107.

In step S107, the data updating unit 15 determines whether or not the command code of the bit difference command obtained in step S104 is a command code (=0) representing an end command. When the command code is 0, the data updating unit 15 determines that the obtained bit difference command is an end copy bit command, and allows the process to proceed to step S113. If not, the data updating unit 15 determines that the obtained bit difference command is an invalid command, and causes the process to return to step S104.

When the process proceeds from step S105 to step S108, the data updating unit 15 stores, into the data D2, an additional bit string of the additional bit command (FIG. 31) obtained in step S104.

FIG. 37 is a view illustrating an exemplary process of the data updating unit 15 in step S108 and step S109. When step S108 is performed in the example in FIG. 37, the data updating unit 15 aligns a top of an additional bit string AddBS of the additional bit command to a position of a storage bit address SBA in the data D2 to store the additional bit string AddBS into the data D2.

In step S109 in FIG. 36, the data updating unit 15 adds, to the storage bit address SBA, an additional bit string length of the additional bit command (FIG. 31) obtained in step S104 to update the storage bit address SBA. When step S109 is performed in the example in FIG. 37, the data updating unit 15 adds, to the storage bit address SBA, an additional bit string length lngAddBS of the additional bit command. Therefore, the storage bit address SBA represents a bit address immediately after the additional bit string AddBS stored in step S108. After step S109, the process returns to step S104.

When the process proceeds from step S106 to step S110, the data updating unit 15 obtains, based on the copy source bit address and the copy bit string length of the copy bit command (FIG. 32) obtained in step S104, a copy bit string from the data D0.

Figure 38:
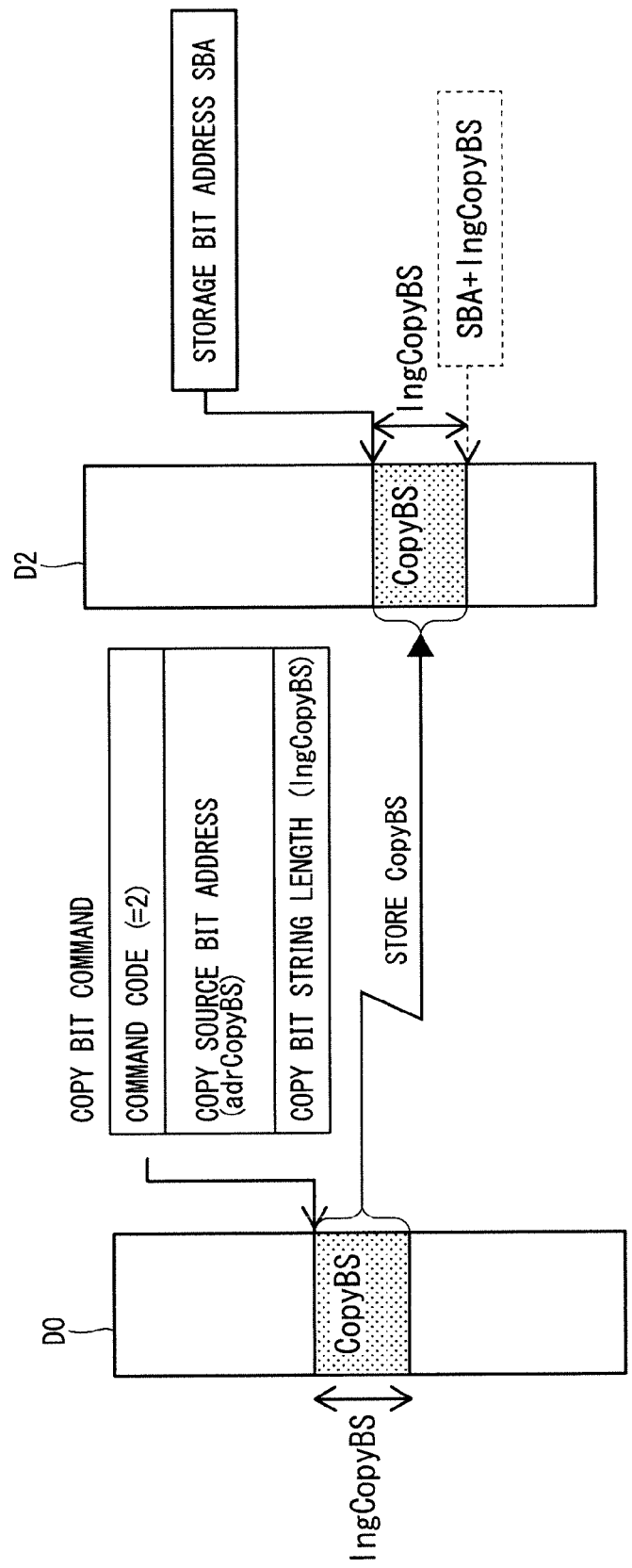
FIG. 38 is a view illustrating an exemplary process of the data updating unit according to the first embodiment.

FIG. 38 is a view illustrating an exemplary process of the data updating unit 15 in step S110 to step S112. When step S110 is performed in the example in FIG. 38, the data updating unit 15 obtains a copy bit string CopyBS from an address indicated by a copy source bit address adrCopyBS in the data D0 to a copy bit string length lngCopyBS.

In step S111 in FIG. 36, the data updating unit 15 stores, into the data D2, the copy bit string obtained in step S110. When step S111 is performed in the example in FIG. 38, the data updating unit 15 aligns a top of the copy bit string CopyBS to a position of the storage bit address SBA in the data D2 to store the copy bit string CopyBS into the data D2.

In step S112 in FIG. 36, the data updating unit 15 adds, to the storage bit address SBA, a copy bit string length of the copy bit command (FIG. 32) obtained in step S104 to update the storage bit address SBA. When step S112 is performed in the example in FIG. 38, the data updating unit 15 adds, to the storage bit address SBA, a copy bit string length lngCopyBS of the copy bit command. Therefore, the storage bit address SBA represents a bit address immediately after the copy bit string CopyBS stored in step S111. After step S112, the process returns to step S104.

When the process proceeds from step S107 to step S113, the data D2 identical to the new data (data D1) is generated. Accordingly, the data updating unit 15 stores the storage bit address SBA as a bit string length lngBS2 of the data D2.

In step S114, the data updating unit 15 stores the data D2 identical to the new data into the data storing unit 14 (FIG. 3). After that, the data updating operation in FIG. 36 ends. Moreover, at this time, the old data may be rewritten into the data D2 identical to the new data, or the old data may be deleted from the data storing unit 14.

<Summary of First Embodiment>

With the differential data creating device 1 according to the first embodiment described above, copy bit strings and additional bit strings are obtained based on old data and new data shifted in a forward direction and a backward direction of a bit string in a range of 0, 1, 2, ..., n bit(s). Therefore, even if a discrepancy occurs in terms of bit between the old data and the new data, in differential data, copy bit strings can be increased, while additional bit strings can be reduced. As a result, the effect of reducing differential data in size can be enhanced.

In addition, with the first embodiment, based on information on intermediate copy bit strings, information on bit strings including at least either of an intermediate copy bit string that does not duplicate each other in a plurality of intermediate copy bit strings and a joined bit string is extracted as final information on copy bit strings. Therefore, the plurality of information on copy bit strings can be integrated into single information on copy bit strings, thus, differential data can be reduced in size.

In addition, with the first embodiment, a plurality of data D1_s is compared in terms of bit with non-shifted old data (data D0) to extract information on intermediate copy bit strings. Therefore, a top portion and an end portion of a copy bit string can be extracted.

In addition, with the first embodiment, differential data is arranged in an order of addresses, in data D1, of copy bit strings and additional bit strings, where copy bit commands (information indicating addresses and lengths of copy bit strings included in the data D0) and additional bit commands (information indicating additional bit strings and lengths of the additional bit strings included in the data D1) are included in the data D1 (new data). Therefore, differential data can be reduced in size as much as possible.

In addition, with the data updating device 11 and the information processing device 21 according to the first embodiment, data identical to new data is generated based on differential data created by the differential data creating device 1 and old data. Therefore, relatively small differential data can be used to update data.

<Second Embodiment>

The differential data creating device 1 according to the first embodiment does not shift the old data (data D0 in the file F0), but shifts the new data (data D1 in the file F1) by −7 to 7 bit(s). In contrast, a differential data creating device 1 according to a second embodiment of the present invention does not shift new data (data D1 in a file F1), but shifts old data (data D0 in a file F0) by −7 to 7 bit(s). Moreover, for the differential data creating device 1 according to the second embodiment, components similar or identical to the above described components are applied with identical reference numerals or signs, and different portions will now mainly be described herein.

Figure 39:
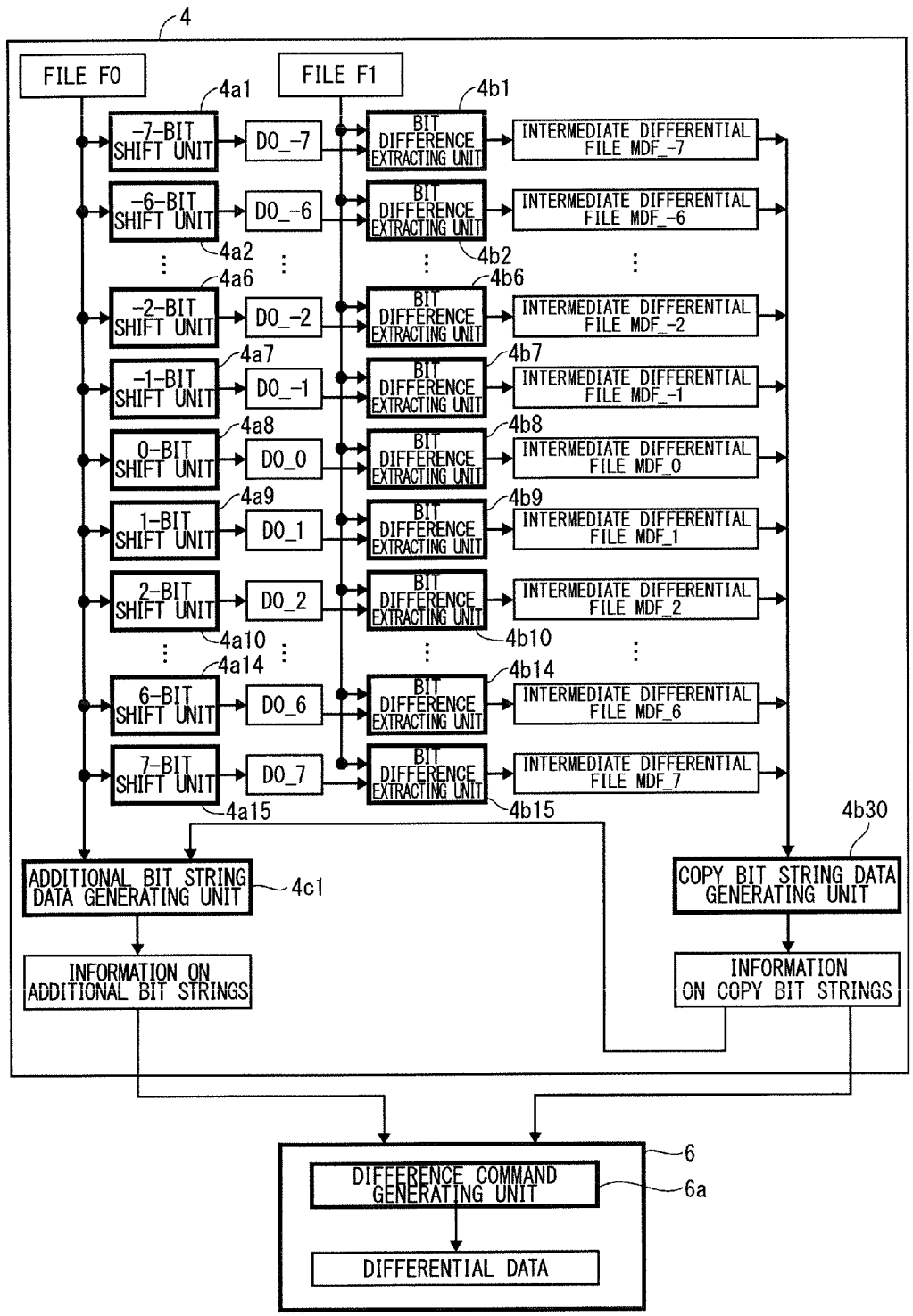
FIG. 39 is a block diagram illustrating an exemplary configuration of a difference extracting unit and a differential data generating unit according to a second embodiment.

FIG. 39 is a block diagram illustrating a detailed exemplary configuration of the difference extracting unit 4 and the differential data generating unit 6 according to the second embodiment. In the configuration in FIG. 39, the file F1 and the file F0 in the configuration in FIG. 15 are replaced with each other. In the configuration in FIG. 39, the −7-bit shift unit 4a1 to the 7-bit shift unit 4a15 shift the old data (data D0 in the file F0) by −7 to 7 bit(s). That is, the −7-bit shift unit 4a1 to the 7-bit shift unit 4a15 shift the old data in a forward direction and a backward direction of its bit string by each of 0, 1, 2, . . . , 7 bit(s) to generate a plurality of data D0_−7 to D0_7. The generated plurality of data D0_7 to D0_7 is stored in an internal memory (not shown).

The bit difference extracting units 4b1 to 4b15 compare the data D0_−7 to D0_7 with non-shifted new data (data D1 in the file F1) in terms of bit and in terms of byte to extract information on bit strings common to these data as information on intermediate copy bit strings. And then the bit difference extracting units 4b1 to 4b15 store the extracted information, as intermediate differential files MDF_−7 to MDF_7, into the intermediate data storing unit 5.

In addition, FIGS. 16, 20, and 21 described in the first embodiment are, in the second embodiment, changed as described below.

In step S4 in FIG. 16, the bit shift unit 4a (−7-bit shift unit 4a1 to 7-bit shift unit 4a15) bit shifts the data D0 by only a bit shift amount s, and stores, into the internal memory, data D0_s obtained through the bit shift. Moreover, when s=0, data D0_0 is non-shifted data D0.

Moreover, in processes of steps in FIG. 20 showing step S4 in detail, processes for the data D0, D1, and D1_s in the first embodiment will be performed respectively for the data D1, D0, and D0_s in the second embodiment.

In step S5 in FIG. 16, the copy bit string extracting unit 4b (bit difference extracting units 4b1 to 4b15) performs a comparison, based on the data D0_s and the data D1, in terms of bit and in terms of byte, to extract an intermediate copy bit string. The copy bit string extracting unit 4b stores information on intermediate copy bit strings, as an intermediate differential file MDF_s, into the intermediate data storing unit 5.

Moreover, in processes of steps in FIG. 21 showing step S5 in detail, processes for the data D0 and D1_s in the first embodiment will be performed respectively for the data D0_s and D1 in the second embodiment.

In this regard, in the first embodiment, in step S28 in FIG. 21, in light of that adr1Is and adr1Ie are respectively a top bit address and an end bit address of an intermediate copy bit string in data D1_s after shifted, adr1Is and adr1Ie are corrected.

In contrast, in the second embodiment, since adr1Is and adr1Ie are respectively a top bit address and an end bit address of an intermediate copy bit string in non-shift data D1, the copy bit string extracting unit 4b does not correct adr1Is and adr1Ie. On the other hand, in the second embodiment, since adr0Is and adr0Ie are respectively a top bit address and an end bit address of an intermediate copy bit string in data D0_s after shifted, the copy bit string extracting unit 4b corrects adr0Is and adr0Ie to addresses used before the bit shift unit 4a perfoiins a shift.

Figure 40:
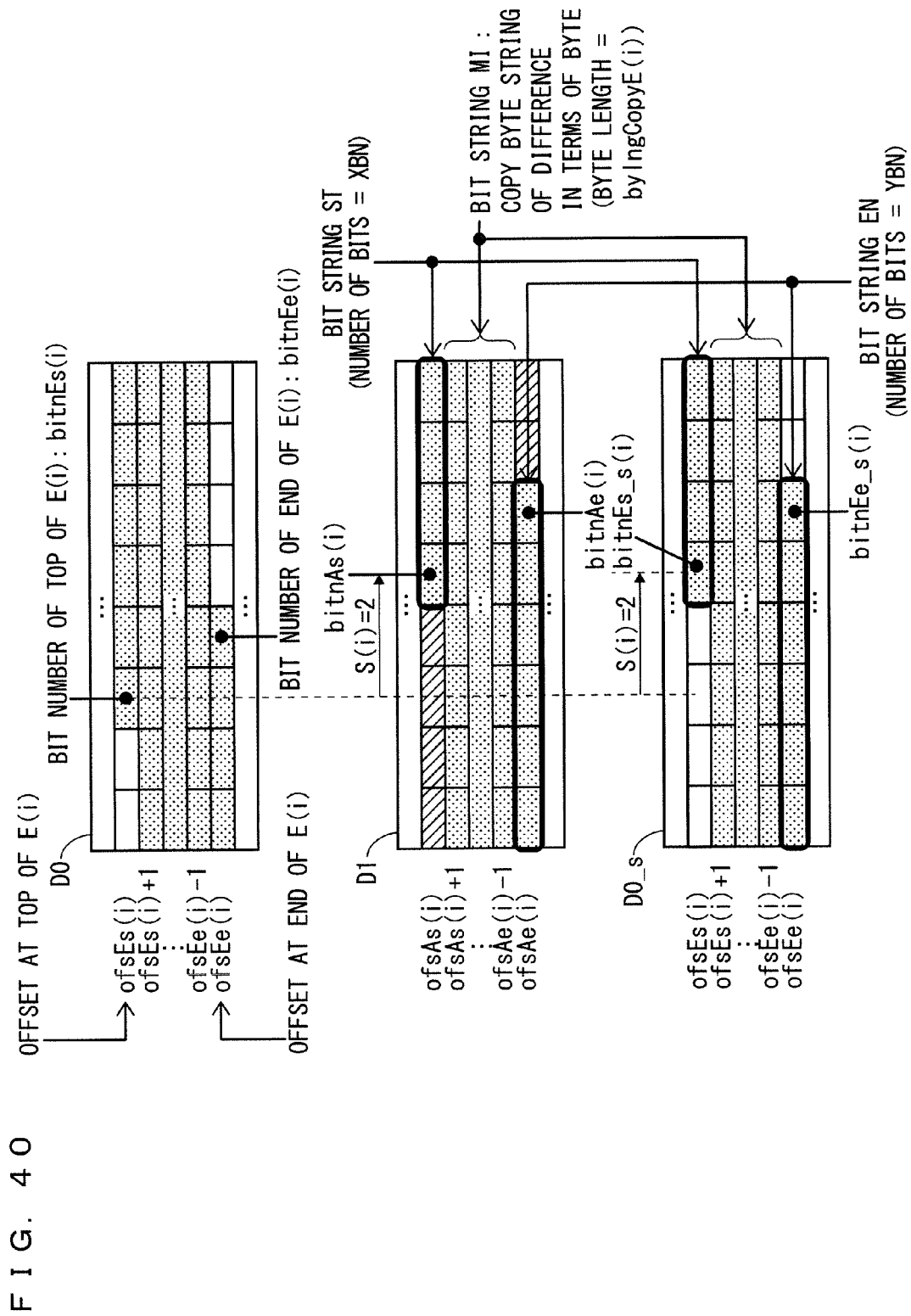
FIG. 40 is a view illustrating an exemplary process of a differential data creating device according to the second embodiment.

FIG. 40 is a view illustrating an exemplary process for extracting the copy bit string E(i) in FIG. 6 by the differential data creating device 1 according to the second embodiment. With reference to FIG. 40 as an example, a process of step S5 according to the second embodiment will now be described herein. In FIG. 40, a bit shift amount s with which the data D0 should be shifted=S(i)=2.

In step S21, the copy bit string extracting unit 4b obtains byte differential data from the data D0_s (data where the data D0 is shifted by only 2 bits) and data D1. The byte differential data obtained in here is data regarding the bit string MI in FIG. 40, and includes a copy command having fields described below. Moreover, for notations of the copy command described below, ofsEs(i) and bylngCopyE(i) in FIG. 40 are used.

Copy source offset=ofsEs(i)+1 (Offset in data D0_s)

Copy byte string length=bylngCopyE(i)

In step S22, the copy bit string extracting unit 4b obtains the above described copy command. Through steps S23 to S25, and in step S26, the copy bit string extracting unit 4b sets a copy source offset (ofsEs(i)+1 in the data D0_s) to OFS0, and sets a copy byte string length (bylngCopyE(i)) to CBYTL. Moreover, OFS1 represents an offset for a top byte string in an additional byte string or a copy byte string in the data D1, and, in here, corresponds to ofsAs(i)+1 in the data Dl in FIG. 40.

In step S26, the copy bit string extracting unit 4b compares 1 byte whose offset is OFS0-1=ofsEs(i) in the data D0_s with 1 byte whose offset is OFS1-1=ofsAs(i) in the data D1 from a bottom level bit in order. Therefore, a bit string ST is obtained, and XBN=4 is obtained. As a result, adr0Is (=bitnEs_s(i)) at a top of an intermediate copy bit string in the data D0_s and add Is (=bitnAs(i)) at a top of an intermediate copy bit string in the data D1 are obtained.

In step S27, the copy bit string extracting unit 4b compares 1 byte whose offset is OFS0+CBYTL=ofsEe(i) in the data D0_s with 1 byte whose offset is OFS1+CBYTL=ofsAe (i) in the data D1 from a top level bit in order. Therefore, a bit string EN is obtained, and YBN=6 is obtained. As a result, adr0Ie (=bitnEe_s(0) at an end of the intermediate copy bit string in the data D0_s and adr1Ie (=bitnAe(i)) at an end of the intermediate copy bit string in the data D1 are obtained.

In step S28, the copy bit string extracting unit 4b shifts adrOIs (=bitnEs_s(i)) and adr0Ie (=bitnEe_s(i)) in the data D0_s in a direction opposite to a direction of a shift (step S4) performed by the bit shift unit 4a. Therefore, bitnEs(i) and bitnEe(i) in the data D0 are obtained.

<Summary of Second Embodiment>

With the differential data creating device 1 according to the second embodiment described above, an effect similar or identical to the first embodiment (for example, an enhanced effect of reducing differential data in size) is obtained.

<Modification Examples of First and Second Embodiments>

In the above described configurations, cases when entire data includes bit strings have been described. However, the present invention is not limited to these configurations, but data in terms of byte and bit string data (data in terms of bit) may be mixed.

In addition, in the above descriptions, information on copy bit strings has first been obtained in step S8 (FIG. 16), and then information on additional bit strings has been obtained by excluding copy bit strings from the new data in step S9. However, the present invention is not limited to this process, but information on additional bit strings may be first obtained, and then information on copy bit strings may be obtained by excluding additional bit strings from new data.

Further, in the above described differential data, copy bit commands and additional bit commands are arranged in an ascending order of addresses, in the data D1, of the copy bit strings and the additional bit strings included in the data D1. However, they may not be arranged in an ascending order, but may be arranged in, for example, a descending order. By summarizing them, copy bit commands and additional bit commands are only required to be sorted in an order of addresses, in data D1, of the copy bit strings and the additional bit strings included in the data D1.

In addition, in the above described configurations, in steps S23, S24, S25, S26, and S27 in FIG. 21, the copy bit string extracting unit 4b compares a plurality of data D1_s with non-shifted old data in terms of both bit and byte to extract an intermediate differential file MDF_s. However, the present invention is not limited to this process, but the copy bit string extracting unit 4b may compare a plurality of data D1_s with non-shifted old data only in terms of bit to extract an intermediate differential file MDF_s.

Further, the differential data creating device 1 may be applied to a vehicle mountable navigation device, a Portable Navigation Device, a communication terminal (for example, potable terminal including cellular phone, smartphone, and tablet), and a differential data creating system configured as a system combined appropriately with a function of an application to be installed into them, a server, and other devices. In this case, each function or each component of the above described differential data creating device 1 may be separately disposed in each device configuring the system, or may be integrally disposed in either of the devices.

Moreover, for the present invention, each of the embodiments and the modification examples may freely be combined, or each of the embodiments and the modification examples may appropriately be changed or omitted, within the scope of the present invention.

Although the present invention has been described in detail, the above descriptions merely show examples in all aspects, and do not intend to limit the present invention. It should be understood that various modification examples that are not exemplified can be expected without diverting from the scope of the present invention.

REFERENCE SIGNS LIST

1: differential data creating device
4a: bit shift unit
4b: copy bit string extracting unit
4c: additional bit string extracting unit
6: differential data generating unit
11: data updating device
21: information processing device

The invention claimed is:

1. A differential data creating apparatus for creating and storing differential data for updating an existing file containing old data so that the updated file will contain new data, the differential data creating apparatus comprising:
   a processor to execute a program; and
   a memory to store the program which, when executed by the processor, performs a process of,
      generating, in parallel, a plurality of data by shifting either of said old data and said new data in a forward direction and a backward direction of its bit string by each of 0, 1, 2, . . . , n bit(s);
      extracting, based on said plurality of data generated and other non-shifted data, information on bit strings common to said old data and said new data as information on copy bit strings;
      extracting information on other bit strings than said copy bit strings in said new data as information on additional bit strings;
      creating said differential data based on said information on copy bit strings and said infoiiiiation on additional bit strings; and
      storing said differential data in a data storage device,
   wherein said file is updated according to said differential data retrieved from said data storage device.

2. The differential data creating apparatus according to claim 1, wherein extracting of said information on copy bit strings comprises:
   extracting, per each piece of data in said plurality of data generated, information on bit strings common to said piece of data and said other non-shifted data, as information on intermediate copy bit strings, and
   extracting, based on said information on the plurality of said intermediate copy bit strings extracted, information on bit strings including at least either of an intermediate copy bit string that does not duplicate each other in said plurality of intermediate copy bit strings and a bit string obtained by joining intermediate copy bit strings that duplicate each other in said plurality of intermediate copy bit strings, as said information on copy bit strings.

3. The differential data creating apparatus according to claim 2, wherein said n is 7, and
extracting of information on intermediate copy bit strings comprises:
  extracting, per piece of data in said plurality of data generated, byte strings common to said piece of data and said other non-shifted data,
  determining whether or not bits included in 1 byte immediately before said byte string extracted from said piece of data conform to bits included in 1 byte immediately before said byte string extracted from said other non-shifted data, in the backward direction of said bit string in order, to obtain a first address of a bit in said piece of data and a second address of a bit of said other non-shifted data, the bits being finally conformed each other,
  determining whether or not bits included in 1 byte immediately after said byte string extracted from said piece of data conform to bits included in 1 byte immediately after said byte string extracted from said other non-shifted data, in the forward direction of said bit string in order, to obtain a third address of a bit in said piece of data and a fourth address of a bit in said other non-shifted data, the bits being finally conformed each other,
  correcting at least either of said first address and said third address to an address used before performing a shift, and,
  generating said information on intermediate copy bit strings, based on at least either of said second and fourth addresses and said first and third addresses which are corrected.

4. The differential data creating apparatus according to claim 1, wherein said differential data created is data in which information indicating addresses and lengths of said copy bit strings included in said old data, and information indicating said additional bit strings included in said new data and lengths of said additional bit strings are arranged in an order of addresses, in said new data, of said copy bit strings and said additional bit strings included in said new data.

5. A data updating apparatus for generating said data identical to said new data, based on said differential data created by the differential data creating apparatus according to claim 1 and said old data.

6. A differential data creating method for creating and storing differential data for updating an existing file containing old data so that the updated file will contain new data, the differential data creating method comprising:
  generating, in parallel, a plurality of data by shifting either of said old data and said new data in a forward direction and a backward direction of its bit string by each of 0, 1, 2, . . . , n bit(s);
  extracting, based on said plurality of data which is generated and other non-shifted data, information on bit strings common to said old data and said new data as information on copy bit strings;
  extracting, from said new data, information on other bit strings than said copy bit strings as information on additional bit strings;
  creating said differential data based on said info' nation on copy bit strings and said information on additional bit strings; and
  storing said differential data in a data storage device,
  wherein said file is updated according to said differential data retrieved from said data storage device.

7. A differential data creating apparatus for creating and providing differential data for updating an existing file containing old data so that the updated file will contain new data, the differential data creating apparatus comprising:
  a processor to execute a program; and
  a memory to store the program which, when executed by the processor, performs a process of,
    generating, in parallel, a plurality of data by shifting either of said old data and said new data in a forward direction and a backward direction of its bit string by each of 0, 1, 2, . . . , n bit(s);
    extracting, based on said plurality of data generated and other non-shifted data, information on bit strings common to said old data and said new data as information on copy bit strings;
    extracting information on other bit strings than said copy bit strings in said new data as information on additional bit strings;
    creating said differential data based on said infomiation on copy bit strings and said information on additional bit strings; and
    providing said differential data via a communication network to an external device,
  wherein said file is updated according to said differential data provided to said external device.

8. A differential data creating method for creating and providing differential data for updating an existing file containing old data so that the updated file will contain new data, the differential data creating method comprising:
  generating, in parallel, a plurality of data by shifting either of said old data and said new data in a forward direction and a backward direction of its bit string by each of 0, 1, 2, . . . , n bit(s);
  extracting, based on said plurality of data which is generated and other non-shifted data, infoimation on bit strings common to said old data and said new data as information on copy bit strings;
  extracting, from said new data, information on other bit strings than said copy bit strings as information on additional bit strings;
  creating said differential data based on said information on copy bit strings and said information on additional bit strings; and
  providing said differential data via a communication network to an external device,
  wherein said file is updated according to said differential data provided to said external device.

* * * * *